United States Patent
Jin et al.

(10) Patent No.: US 12,323,719 B2
(45) Date of Patent: Jun. 3, 2025

(54) IMAGE SENSOR FOR DISTANCE MEASUREMENT AND IMAGE SENSOR MODULE INCLUDING THE IMAGE SENSOR

(71) Applicant: Samsung Electronics Co., Ltd., Suwon-si (KR)

(72) Inventors: Younggu Jin, Osan-si (KR); Youngchan Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 196 days.

(21) Appl. No.: 17/843,123

(22) Filed: Jun. 17, 2022

(65) Prior Publication Data
US 2022/0417460 A1    Dec. 29, 2022

(30) Foreign Application Priority Data
Jun. 28, 2021  (KR) .................. 10-2021-0084191

(51) Int. Cl.
*H04N 25/705* (2023.01)
*H04N 25/621* (2023.01)
(Continued)

(52) U.S. Cl.
CPC ......... *H04N 25/705* (2023.01); *H04N 25/621* (2023.01); *H04N 25/702* (2023.01); *H04N 25/77* (2023.01); *H04N 25/78* (2023.01)

(58) Field of Classification Search
CPC .. H04N 25/705; H04N 25/621; H04N 25/702; H04N 25/77; H04N 25/78;
(Continued)

(56) References Cited

U.S. PATENT DOCUMENTS 10,133,143 B2    11/2018    Huh et al.
10,445,893 B2    10/2019    Bleyer et al.
(Continued)

FOREIGN PATENT DOCUMENTS

EP    3343902 A1    7/2018

OTHER PUBLICATIONS

Screen captures from YouTube video clip entitled "12.9" iPad Pro 2020 Teardown What does the LiDAR scanner look like 1 page, uploaded on Mar. 28, 2020, retrieved from Internet: www.youtube.com/watch?v=xz6CExnGw9w.
(Continued)

*Primary Examiner* — Chiawei Chen
*Assistant Examiner* — Angel L Garces-Rivera
(74) *Attorney, Agent, or Firm* — Harness, Dickey & Pierce, P.L.C.

(57) ABSTRACT

An image sensor for distance measurement and an image sensor module including the image sensor are provided. The image sensor includes: a pixel array including a plurality of pixels including a plurality of first pixels arranged on a first line and a plurality of second pixels arranged on a second line, wherein the plurality of first pixels and the plurality of second pixels are arranged to be staggered from each other, and each of the plurality of first pixels and the plurality of second pixels includes a plurality of modulation gates for receiving a plurality of modulated signals during a photocharge collection period; a row decoder that provides control signals and the plurality of modulated signals to the pixel array; and an analog-to-digital conversion circuit that receives a plurality of sensing signals from the pixel array and converts the plurality of sensing signals into a plurality of digital signals.

18 Claims, 29 Drawing Sheets

(51) Int. Cl.
 *H04N 25/702* (2023.01)
 *H04N 25/77* (2023.01)
 *H04N 25/78* (2023.01)

(58) Field of Classification Search
 CPC .... H04N 25/745; H04N 25/75; G01S 7/4816; G01S 7/4863; G01S 17/36; G01S 17/86; G01S 17/894; G01S 7/4865; H01L 27/14656; H01L 27/1464; H01L 27/14612; H01L 27/14607; H01L 27/14603; H01L 27/14609; H01L 27/1463
 See application file for complete search history.

(56) References Cited

U.S. PATENT DOCUMENTS

| | | | |
|---|---|---|---|
| 10,616,519 | B2 | 4/2020 | Elkhatib et al. |
| 10,707,247 | B2 | 7/2020 | Tian et al. |
| 2018/0301484 | A1* | 10/2018 | Vaartstra ........... H01L 27/14621 |
| 2019/0386050 | A1 | 12/2019 | Kim et al. |
| 2022/0329744 | A1* | 10/2022 | Jang ......................... G06T 7/70 |

OTHER PUBLICATIONS

Junren Luo et al., "Hexagonal Convolutional Neural Networks for Hexagonal Grids," IEEE Access, vol. 7, Sep. 30, 2019.

\* cited by examiner

IMAGE SENSOR FOR DISTANCE MEASUREMENT AND IMAGE SENSOR MODULE INCLUDING THE IMAGE SENSOR

CROSS-REFERENCE TO RELATED APPLICATION

This application is based on and claims priority under 35 U.S.C. § 119 to Korean Patent Application No. 10-2021-0084191, filed on Jun. 28, 2021, in the Korean Intellectual Property Office, the disclosure of which is incorporated by reference herein in its entirety.

BACKGROUND

The inventive concepts relate to an image sensor, and more particularly, to an image sensor for measuring a distance and an image sensor module including the image sensor.

A time of flight (ToF)-based three-dimensional (3D) image sensor may generate a 3D image of a target object by measuring a distance to the target object. Specifically, an image sensor performing ToF-based distance measurement may calculate a distance to a target object by measuring a time until a pulsed light signal, emitted from a light source, returns from being reflected by the target object The measurements made by the image sensor may be used to generate a 3D image of the target object based on the calculated distance. As a light signal output from the light source, a microwave, a light wave, an ultrasonic wave, and/or the like may be used.

SUMMARY

The inventive concepts provide an image sensor with improved sensing performance and an image sensor module including the image sensor.

According to an aspect of the inventive concepts, there is provided an image sensor for distance measurement, the image sensor including: a pixel array including a plurality of pixels, the plurality of pixels including a plurality of first pixels on a first line, and a plurality of second pixels on a second line adjacent to the first line, wherein the plurality of first pixels and the plurality of second pixels are staggered from each other, and each of the plurality of first pixels and the plurality of second pixels includes a plurality of modulation gates configured to receive a plurality of modulated signals during a photocharge collection period; a row decoder configured to provide control signals and the plurality of modulated signals to the plurality of first pixels and the plurality of second pixels of the pixel array; and an analog-to-digital conversion circuit configured to receive a plurality of sensing signals from the pixel array and to convert the plurality of sensing signals into a plurality of digital signals.

According to another aspect of the inventive concept, there is provided an image sensor for distance measurement, the image sensor including: a pixel array including a plurality of pixels, the plurality of pixels including a first pixel in a first row and a second pixel in a second row adjacent to the first row, wherein the first pixel and the second pixel are staggered from each other in a column direction, wherein each of the plurality of pixels includes a charge collector configured to generate a charge according to a received light signal; a first tap configured to transmit a first phase component of the charge in response to a first modulated signal; a second tap configured to transmit a second phase component of the charge in response to a second modulated signal having a same frequency as and a different phase from the first modulated signal; and at least one read circuit connected to the first tap and the second tap.

According to another aspect of the inventive concepts, there is provided an image sensor module including: a light source configured to irradiate modulated light to an object; and an image sensor configured to measure a distance to the object by sensing the modulated light reflected from the object, the image sensor including a pixel array including a plurality of pixels staggered from each other, each of the plurality of pixels including a plurality of modulation gates configured to receive a plurality of modulated signals during a photocharge collection period; and a row decoder configured to provide a control signal and the plurality of modulated signals to the plurality of pixels.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION OF THE EMBODIMENTS

Figure 1:
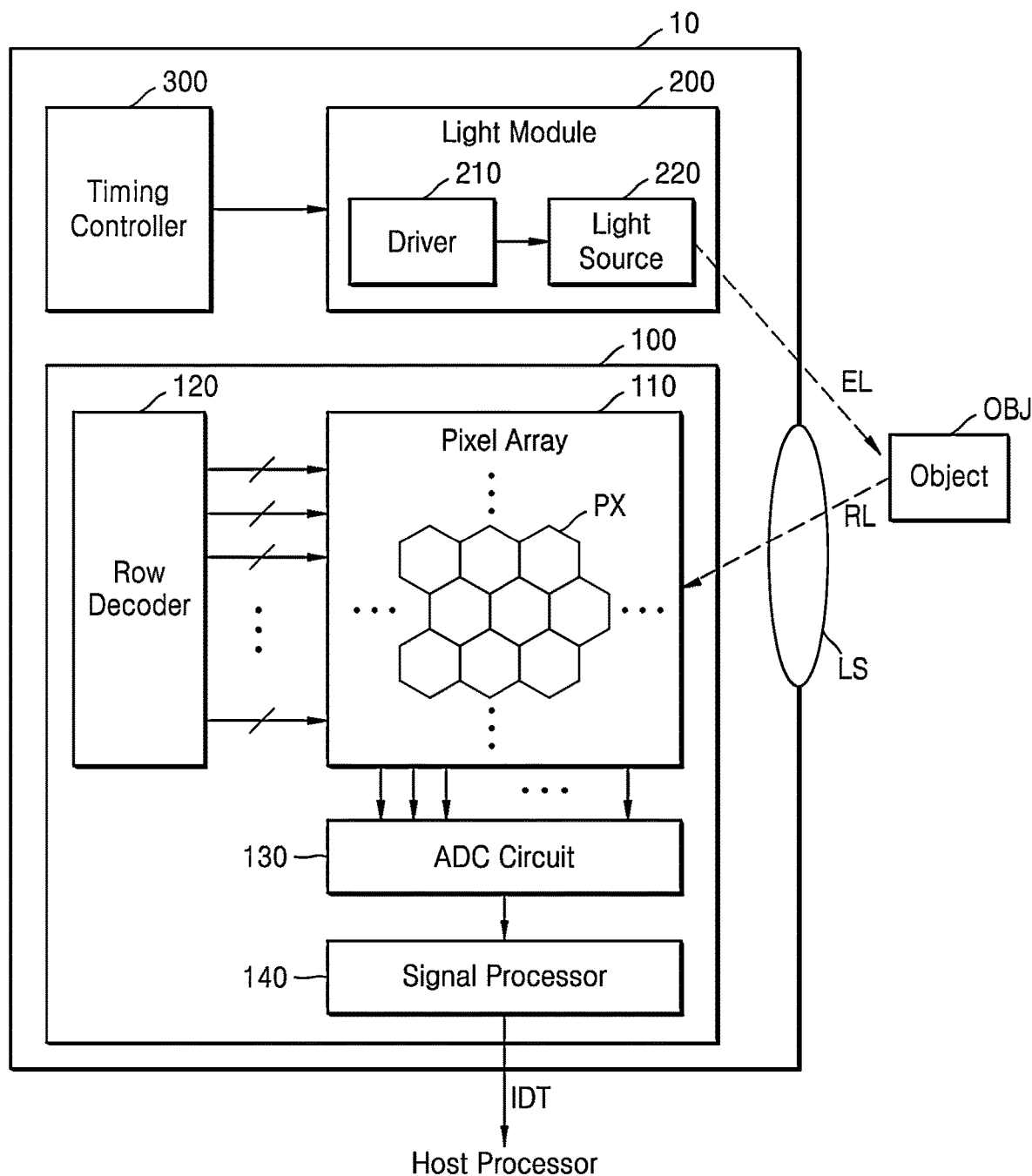
FIG. 1 is a block diagram of an image sensor module according to some example embodiments.

Hereinafter, some example embodiments of the inventive concepts will be described in detail with reference to the accompanying drawings. The same reference numerals denote the same components in the drawings, and duplicate descriptions thereof are omitted.

When the terms "about" or "substantially" are used in this specification in connection with a numerical value, it is FIG. 1 is a block diagram of an image sensor module 10 according to some example embodiments.

The image sensor module 10 may obtain distance information by measuring a distance between an object OBJ and the image sensor module 10. The distance information may be used in, e.g., a three-dimensional (3D) user interface of a device on which the image sensor module 10 is mounted, and thus, a user may interact with a 3D image of the object OBJ as a part of a game (and/or another application) and/or to generate 3D image data IDT, for example, a distance image (and/or a depth image).

The image sensor module 10 may be mounted on an electronic device that performs distance measurement. For example, the image sensor module 10 may be applied to a mobile device, a cellphone, a smartphone, a user equipment (UE), a wearable device, a tablet, a digital camera, a laptop or desktop computer, an electronic smartwatch, a machine-to-machine (M2M) communication device, a virtual reality (VR) device, a laser detection and ranging (LADAR) device, an infrared microscope, an infrared telescope, a game console in a video game room, an interactive video terminal, a mounted (and/or integrated) camera in an automobile, a machine vision system or module, a robot, and/or the like. In addition, the image sensor module 10 may be used in various applications, such as a body thermal imaging device, an environmental monitoring system (such as an unmanned product monitor and a marine pollution monitor), a temperature monitoring system in a semiconductor process line, a building insulation and leak detection system, an electrical/electronic printed circuit board (PCB) circuit and component inspection system, and/or the like.

The image sensor module 10 may include an image sensor 100, a light module 200, a timing controller 300, and a lens LS. In addition, the image sensor module 10 may further include and/or be connected to general-purpose components such as a memory and a processor.

In some example embodiments, the image sensor module 10 may be integrated into one semiconductor chip. In some example embodiments, the image sensor 100, the light module 200, and/or the timing controller 300 may be implemented as separate semiconductor chips. For example, in some embodiments, the timing controller 300 may be integrated with the image sensor 100 in one semiconductor chip.

The timing controller 300 may control the operation timing of each of the image sensor 100 and the light module 200. For example, the timing controller 300 may generate a light emission control signal based on a clock signal generated internally and/or transmitted from an external processor (e.g., a host processor) and provide the light emission control signal to a driver 210 of the light module 200, and/or the timing controller 300 may generate a photodetection control signal and a row address signal based on the clock signal and transmit the photodetection control signal and the row address signal to a row decoder 120. Also, the timing controller 300 may control operation timings of an analog-to-digital conversion (ADC) circuit 130 and a signal processor 140.

The light module 200 may include the driver 210 and a light source 220. The light source 220 may include, for example, a laser diode (LD) and/or light-emitting diode (LED) that emits at least one of infrared or visible light, a near-infrared laser (NIR), a point light source, a monochromatic illumination source (e.g., having a combination of a white lamp and a monochromator), and/or a combination of other laser light sources. For example, in some embodiments, the light source 220 may emit infrared light having a wavelength of about 800 nm to about 1000 nm.

The driver 210 may drive the light source 220 so that the light source 220 irradiates modulated light EL to the object OBJ (e.g., based on the light emission control signal received from the timing controller 300). The modulated light EL may be used to scan the object OBJ that is a 3D object. The modulated light EL may be a sine wave or a square wave having a certain frequency.

In some example embodiments, the modulated light EL may be used to point-scan the object OBJ. For example, during point scan, the light source 220 may project light spots on the surface of the object OBJ along a scan line.

In some example embodiments, the light source 220 may include a hexagonal patterned laser spot array. The modulated light EL output from the light source 220 may include light spots in a hexagonal pattern.

Reflected light RL reflected from the object OBJ may be incident on the image sensor 100 through the lens LS. The lens LS may be, for example, a focusing lens having a glass and/or plastic surface, or a cylindrical optical element, which focuses the reflected light EL received from the object OBJ onto one or more pixels of a two-dimensional (2D) pixel array 110 of the image sensor 100.

The image sensor 100 may measure a distance to the object OBJ (and/or a distance to a plurality of positions of the object OBJ) based on the reflected light RL reflected from the object OBJ. The image sensor 100 may demodulate the reflected light RL and output modulated light as an electrical signal.

The image sensor 100 may include the pixel array 110, the row decoder 120 (and/or a row driver), the ADC circuit 130, and the signal processor 140. In addition, the image sensor 100 may further include a memory (not illustrated) for storing image data IDT or temporarily storing data provided from the ADC circuit 130 to the signal processor 140. The memory may be implemented as a volatile memory and/or as a non-volatile memory.

The pixel array 110 may include a plurality of pixels PX arranged in two dimensions, and each of the plurality of pixels PX converts a received light signal into a corresponding electrical signal and outputs a converted signal as a pixel signal. A plurality of row interconnection lines extending in a row direction and a plurality of column interconnection lines extending in a column direction may be connected to the plurality of pixels PX, and driving signals and a plurality of photo gate signals may be applied to the plurality of pixels PX from the row decoder 120 through the plurality of row interconnection lines.

In some example embodiments, the plurality of pixels PX may be arranged to be staggered in a row direction and/or a column direction on a 2D plane of the pixel array 110. For example, centers of two adjacent pixels PX may be arranged to be staggered in a row direction or a column direction.

In some example embodiments, a layout of each of the plurality of pixels PX may have a hexagonal pattern, and centers of two adjacent pixels PX may be arranged to be staggered. However, the example embodiments are not limited thereto. For example, a layout of each of the plurality of pixels PX may have a rectangular pattern, and centers of two adjacent pixels PX may be arranged to be staggered. In some example embodiments, the layout for each of the plurality of pixels (e.g., the hexagonal pattern and/or the rectangular pattern) may be a layout on the backside on which light is incident. For example, the plurality of pixels PX may be separated by a structure of a deep trench insulator (DTI) including a metal material, and the form of a grid represented by the structure of the DTI on the backside may have a hexagonal pattern and/or a rectangular pattern. The structure of the DTI on the backside may have a staggered pattern.

In some example embodiments, each of the plurality of pixels PX may include a plurality of taps or a plurality of modulation transistors. Each of the modulation transistors may refer to a transistor that receives a modulated signal through a gate thereof during an integration period in which photocharges are collected. The gate of the modulation transistor will be referred to as a modulation gate. Each of the taps may refer to a unit circuit capable of discriminating and transmitting photocharges by phase, the photocharges being generated and accumulated in the pixel PX by irradiation of the reflected light RL. The tap may include at least a plurality of transistors, and at least one of the plurality of transistors may be a modulation transistor.

In some example embodiments, each of the plurality of pixels PX may include a storage device (such as a storage transistor or a storage diode) for storing photocharges. In some example embodiments, each of the plurality of pixels PX may include a photodiode and/or a drain shutter.

The row decoder 120 may select a plurality of pixels PX in row units and drive the selected pixels PX. The row decoder 120 may, for example, generate driving signals for driving each row, and the driving signals may include, for example, an overflow gate signal, a photo gate signal, a shutter control signal, a storage control signal, a transmission control signal, a reset signal, a selection signal, and/or the like.

The row decoder 120 may also generate a plurality of modulated signals. The plurality of modulated signals may be signals having a certain phase difference from the modulated light EL. For example, the row decoder 120 may generate a first modulated signal and a second modulated signal having phase differences of 0° and 180°, respectively, from the modulated light EL, and provide the first modulated signal and the second modulated signal to a selected pixel PX. Pixel signals including phase information generated from the pixel PX in response to the first modulated signal and the second modulated signal may be output from the pixel PX.

As another example, the row decoder 120 may generate a first modulated signal, a second modulated signal, and a third photo gate signal having phase differences of 0°, 120°, and 240°, respectively, from the modulated light EL, and/or may generate a first modulated signal, a second modulated signal, a third modulated signal, and a fourth modulated signal having phase differences of 0°, 90°, 180°, and 270°, respectively, from the modulated light EL, and provide the first to fourth modulated signals to a selected pixel PX. For example, the plurality of modulated signals may be a plurality of photo gate signals. As another example, the plurality of modulated signals may be a plurality of shutter control signals. As another example, the plurality of modulated signals may include an overflow gate signal and a photo gate signal.

The ADC circuit 130 may generate a plurality of pixel values by analog-digitally converting a plurality of sensing signals received from the pixel array 110. The plurality of sensing signals are output voltages output from pixels PX arranged in the same row from among the plurality of pixels PX of the pixel array 110, and may be referred to as pixel signals. The pixel signals may be output in row units and provided to the ADC circuit 130.

In some example embodiments, the ADC circuit 130 may include a correlated double sampling (CDS) circuit that removes noise by performing CDS on a plurality of received pixel signals. The ADC circuit 130 may generate a plurality of pixel values based on pixel signals from which noise has been removed.

The signal processor 140 may process the plurality of pixel values to calculate a distance from the object OBJ and generate distance information or the image data IDT that is 3D image data. For example, the signal processor 140 may calculate the distance by combining pieces of phase information indicated by the plurality of pixel values. The signal processor 140 may provide the distance information or the image data IDT to a host processor.

In the image sensor module 10 according to some example embodiments, the pixel array 110 of the image sensor 100 has a hexagonal pattern in which the layout of each of the plurality of pixels PX has a hexagonal shape, or the pixel array 110 has a staggered pattern in which pixels PX are arranged to be staggered between columns or rows. The pixel array 110 having a hexagonal pattern (and/or a staggered pattern) may match light spots of a hexagonal pattern, and thus, the sensing efficiency of the image sensor 100 may be improved. Also, the image sensor 100 may generate image data IDT suitable for object recognition by, e.g., a neural network operation based on a plurality of pixel signals generated from the pixel array 110 having a hexagonal pattern (and/or a staggered pattern).

Figure 2A:
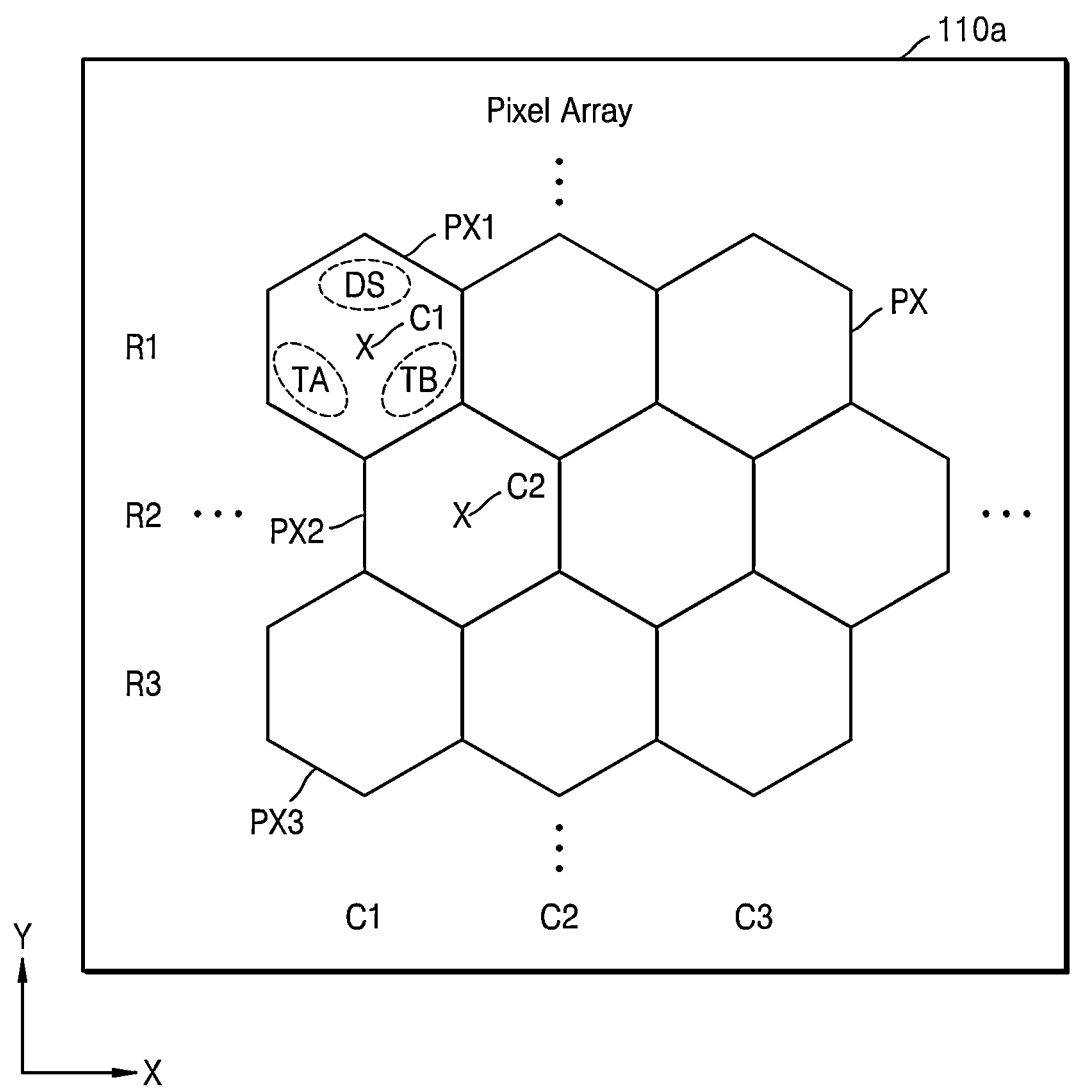
FIGS. 2A and 2B illustrate implementations of pixel arrays according to some example embodiments.
Figure 2B:
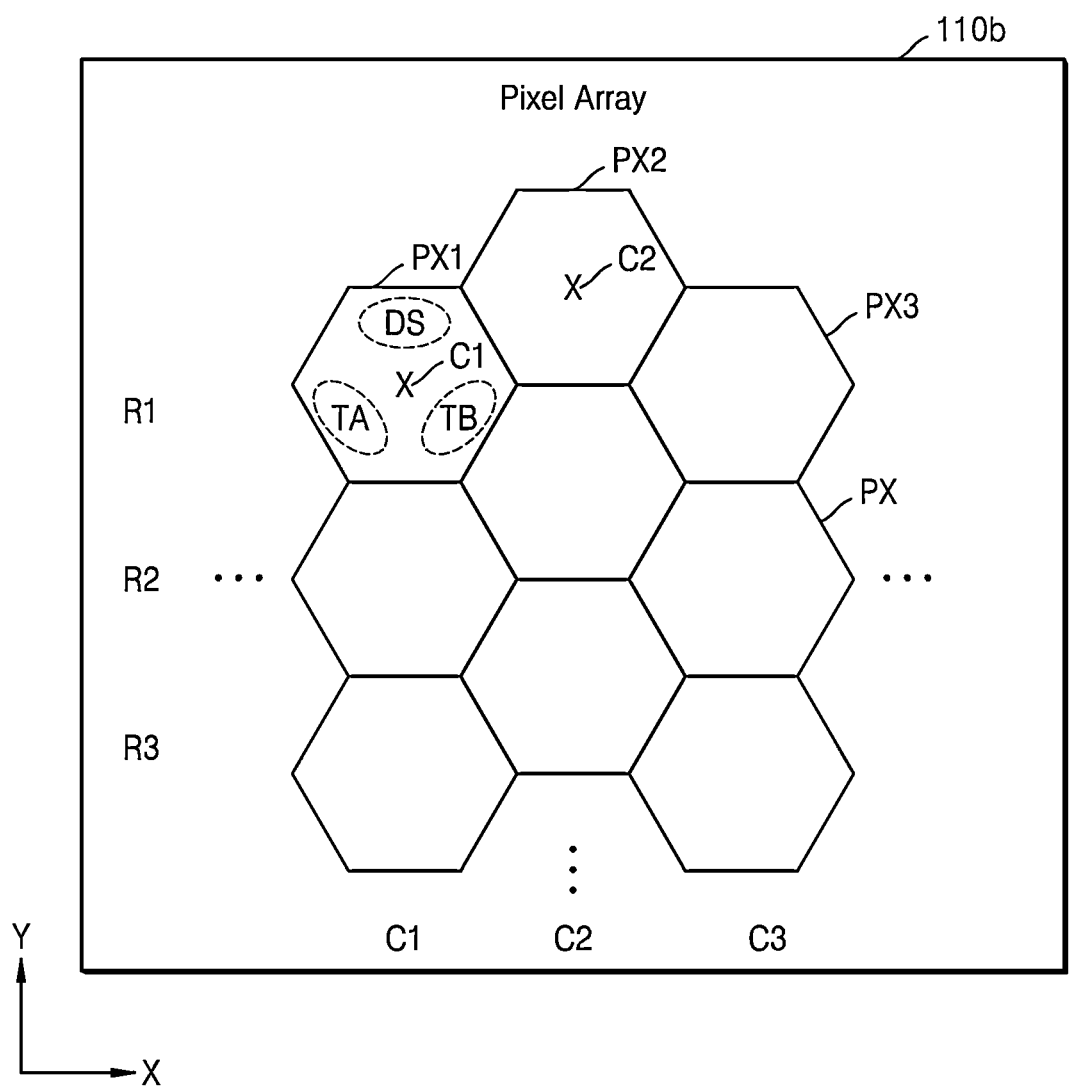

FIGS. 2A and 2B illustrate implementations of pixel arrays according to some example embodiment. A pixel array 110a of FIG. 2A and a pixel array 110b of FIG. 2B may be applied as the pixel array 110 of FIG. 1.

Referring to FIGS. 2A and 2B, each of the pixel arrays 110a and 110b may include a plurality of pixels PX arranged in a plurality of rows, for example, first, second, and third rows R1, R2, and R3, and a plurality of columns, for example, first, second, and third columns C1, C2, and C3. Although nine pixels PX are illustrated for convenience of description, the number of pixels PX in each of the pixel arrays 110a and 110b the number of pixels PX is not so limited and may be determined by the resolution of each of the pixel arrays 110a and 110b.

Each of the plurality of pixels PX may include a plurality of taps, for example, a first tap TA and a second tap TB. However, the example embodiments are not limited thereto, and in some embodiments, each of the plurality of pixels PX may include one tap. Each of the plurality of pixels PX may further include a drain shutter DS.

In some embodiments, as shown in FIGS. 2A and 2B, the pixel PX may have a hexagonal shape. However, the example embodiments are not limited thereto, and the pixel PX may have a rectangular (and/or another polygonal) shape.

Referring to FIG. 2A, pixels PXs arranged in adjacent rows may be arranged to be staggered. For example, pixels PX arranged in the first row R1 and pixels PX arranged in the second row R2 may be arranged to be staggered. Accordingly, a first pixel PX1 arranged in the first row R1 and a second pixel PX2 adjacent to the first pixel PX1 and arranged in the second row R2 may be arranged to be staggered in a column direction, for example, a Y-axis direction. In other words, the center C1 of the first pixel PX1 and the center C2 of the second pixel PX2 may not coincide with each other in the Y-axis direction and may be staged.

A second pixel PX2 arranged in the second row R2 and a third pixel PX3 adjacent to the second pixel PX2 and arranged in the third row R3 may be arranged to be staggered in the Y-axis direction. The first pixel PX1 arranged in the first row R1 and the third pixel PX3 arranged in the third row R3 may be arranged to coincide with each other in the Y-axis direction.

For example, in the pixel array 110a, pixels PXs arranged in an odd row and pixels PXs arranged in an even row may be arranged to be staggered in a column direction, and pixels PX arranged in odd rows may be arranged to coincide with one another in the column direction.

Referring to FIG. 2B, pixels PXs arranged in adjacent columns may be arranged to be staggered. For example, pixels PX arranged in the first column C1 and pixels PX arranged in the second column C2 may be arranged to be staggered. Accordingly, a first pixel PX1 arranged in the first column C1 and a second pixel PX2 adjacent to the first pixel PX1 and arranged in the second column C2 may be arranged to be staggered in a row direction, for example, an X-axis direction. In other words, the center C1 of the first pixel PX1 and the center C2 of the second pixel PX2 may not coincide with each other in the X-axis direction and may be staggered.

A second pixel PX2 arranged in the second column C2 and a third pixel PX3 adjacent to the second pixel PX2 and arranged in the third column C3 may be arranged to be staggered in the X-axis direction. The first pixel PX1 arranged in the first column C1 and the third pixel PX3 arranged in the third column C3 may be arranged to coincide with each other in the X-axis direction.

In other words, in the pixel array 110b, pixels PXs arranged in an odd column and pixels PXs arranged in an even column may be arranged to be staggered in a row direction, and pixels PX arranged in odd columns may be arranged to coincide with one another in the row direction.

As described with reference to FIGS. 2A and 2B, in the pixel arrays 110a and 110b, according to some example embodiments, pixels PX may be arranged to be staggered in a row direction or a column direction.

Figure 3A:
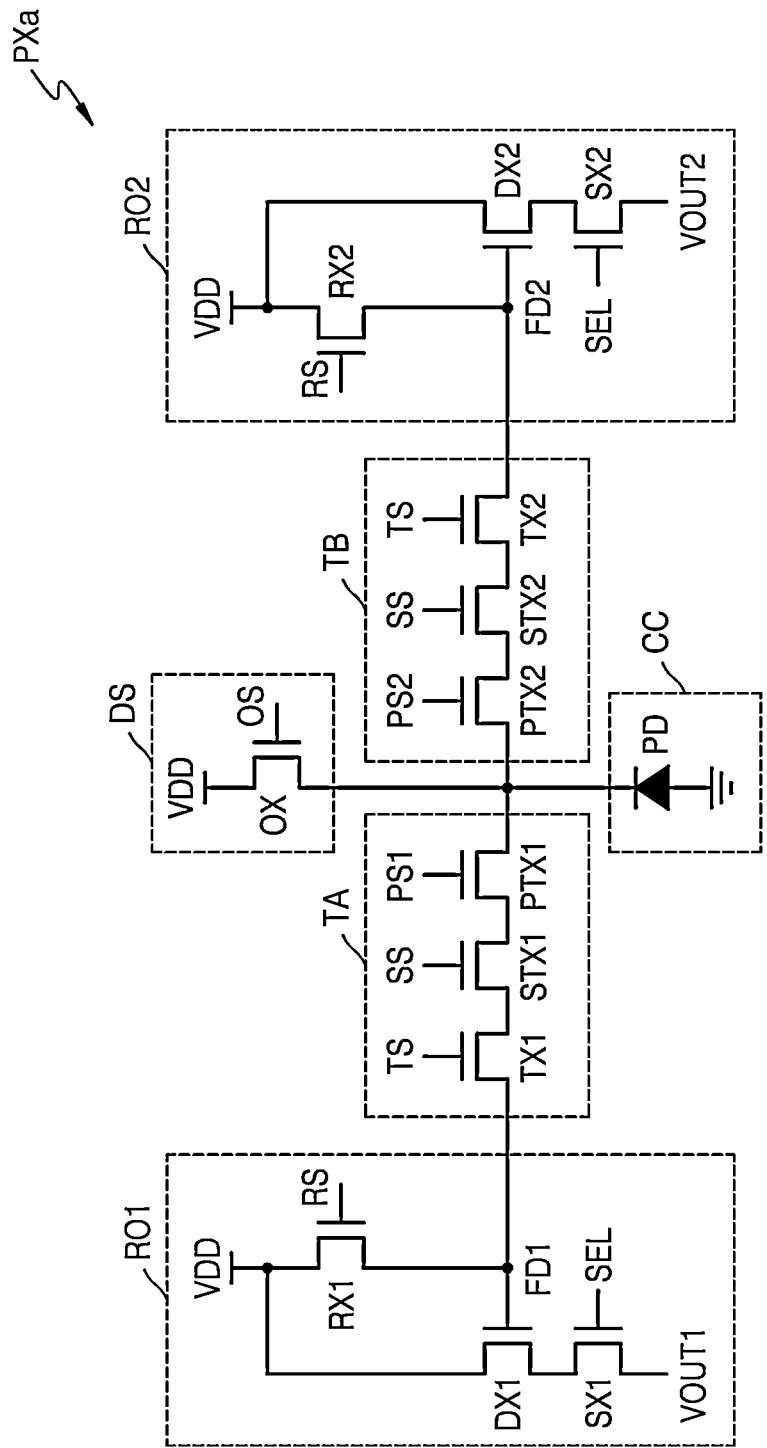
FIGS. 3A and 3B illustrate equivalent circuits of pixels according to some example embodiments.
Figure 3B:
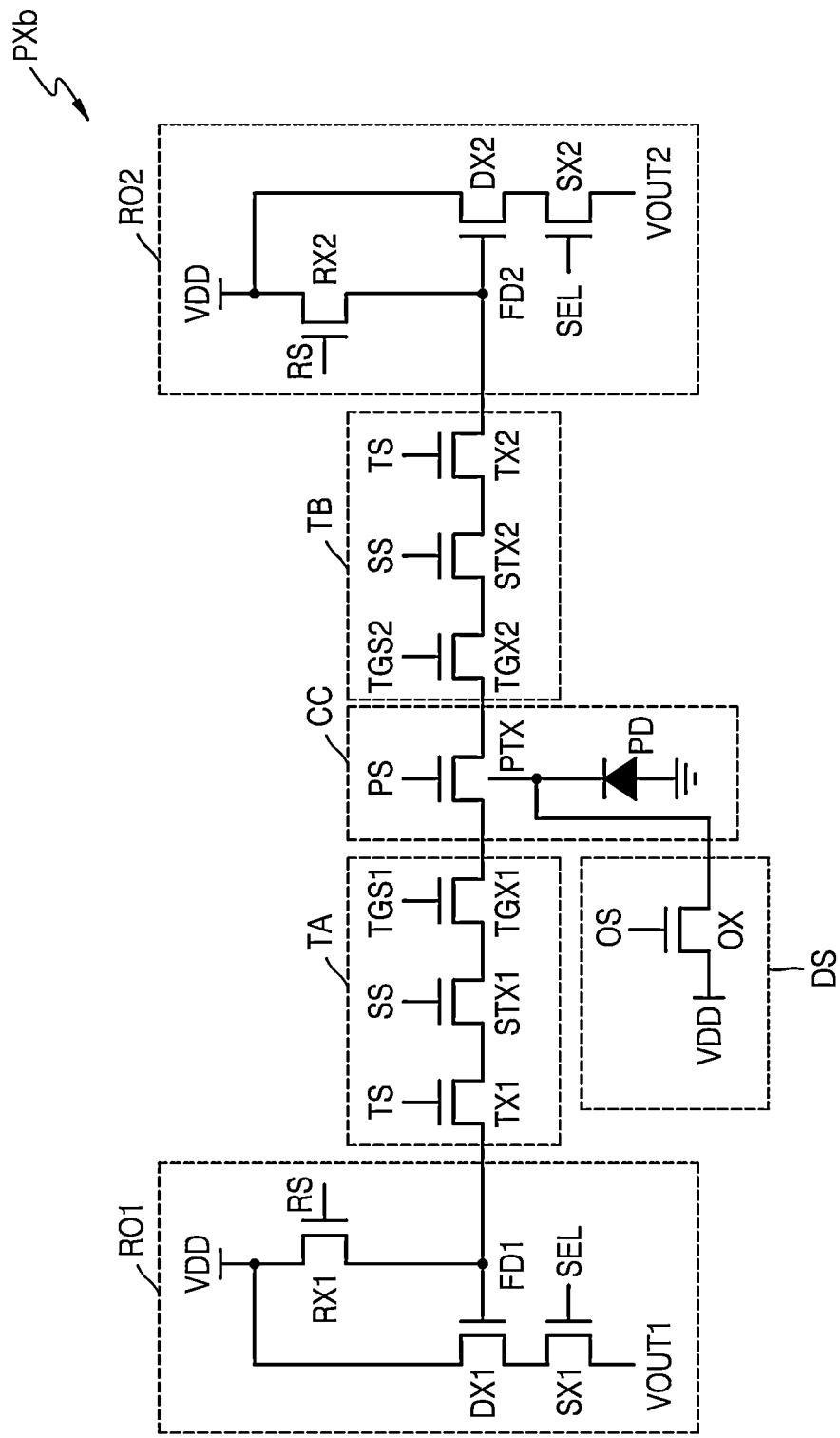

FIGS. 3A and 3B illustrate equivalent circuits of pixels according to some example embodiments. A pixel PXa of FIG. 3A and a pixel PXb of FIG. 3B may be applied as the pixels PX of FIGS. 1, 2A, and 2B.

FIG. 3A illustrates an equivalent circuit of a pixel PXa having a two-tap circuit structure of a photo gate modulation scheme, and FIG. 3B illustrates an equivalent circuit of a pixel PXb having a two-tap circuit structure of a static photo gate scheme. The tap may refer to a unit component capable of discriminating and transmitting photocharges by phase, the photocharges being generated and accumulated in a pixel by irradiation from external light. The image sensor 100 in FIG. 1 may implement a method of discriminating and transmitting charges by 0° and 180° phases and/or by 90° and 270° phases, the charges being generated according to a light signal received by the pixels PXa and PXb by using two taps.

Referring to FIG. 3A, the pixel PXa may include a first tap TA, a second tap TB, a drain shutter DS, a charge collector CC, a first read circuit RO1, and a second read circuit RO2. In some embodiments, the pixel PXa may include one read circuit, and the first tap TA and the second tap TB may share the read circuit, or the pixel PXa may share the read circuit with another pixel PXa adjacent to the pixel PXa. In some embodiments, the drain shutter DS may be omitted.

The charge collector CC may include a photoelectric conversion device PD. The photoelectric conversion device PD may generate photocharges generated by incident reflected light. The photoelectric conversion device PD may be a photo-sensing device and may include a photo diode, a photo gate, a pinned photo diode (PPD), and/or the like.

The drain shutter DS may include an overflow transistor OX. The overflow transistor OX may be connected between a conductive line to which a power voltage VDD is supplied and phototransistors PTX1 and PTX2. Herein, "connected" may mean directly connected and/or electrically connected. The overflow transistor OX may prevent charges generated by the photoelectric conversion device PD from overflowing into storage transistors STX1 and STX2. The overflow transistor OX may be turned on or off according to a logic level of an overflow gate signal OS applied to the gate of the overflow transistor OX. When the overflow transistor OX is turned on in response to an active level of the overflow gate signal OS, for example, a high level, the power voltage VDD may be provided to the photoelectric conversion device PD. In some embodiments, the overflow transistor OX may be turned on before an integration period for collecting photocharges in the pixel PXa starts, and thus may remove (or reset) photocharges accumulated in the photoelectric conversion device PD. The overflow transistor OX may be turned off during the integration period, and may be repeatedly turned on and turned off during a readout period and remove photocharges generated in the photoelectric conversion device PD during the readout period. Accordingly, the overflow transistor OX may perform a global shutter function.

The first tap TA may include the phototransistor PTX1, the storage transistor STX1, and a transfer transistor TX1.

The phototransistor PTX1 may be turned on or off in response to a first photo gate signal PS1. The phototransistor PTX1 may be turned on in response to an active level, for example, a high level, of the first photo gate signal PS1 and electrically connect the photoelectric conversion device PD to the storage transistor STX1. When the phototransistor PTX1 is turned on, photocharges collected by the charge collector CC, for example, photocharges generated by the photoelectric conversion device PD, may be provided to the storage transistor STX1.

The first photo gate signal PS1 may have an inactive level, e.g., a low level, before and after the integration period. The first photo gate signal PS1 may be a modulated signal that is toggled between an active level and an inactive level during the integration period. The first photo gate signal PS1 may be a modulated signal having the same frequency as the modulated light EL irradiated from, e.g., the light source 220 in FIG. 1 to the object OBJ, and may have the same phase as the modulated light EL or may have a phase difference of 90° from the modulated light EL. The phototransistor PTX1 may repeat the turn-on and/or turn-off in the integration period in response to the first photo gate signal PS1 and provide photocharges generated by the photoelectric conversion device PD to the storage transistor STX1.

The storage transistor STX1 may be connected between the phototransistor PTX1 and the transfer transistor TX1. The storage transistor STX1 may temporarily accumulate photocharges received from the photoelectric conversion device PD through the phototransistor PTX1 in response to a storage control signal SS. The storage transistor STX1 may be turned on in the integration period and the readout period and accumulate photocharges.

In some example embodiments, the storage transistor STX1 may be replaced with a storage diode. Alternatively, a storage diode may be connected to the source of the storage transistor STX1.

The transfer transistor TX1 may be connected between the storage transistor STX1 and a floating diffusion node FD1. The transfer transistor TX1 may transfer the photocharges accumulated in the storage transistor STX to the floating diffusion node FD1 in response to a transfer gate signal TS. The transfer transistor TX1 may be turned on during the readout period and transfer photocharges to the floating diffusion node FD1.

The second tap TB may include the phototransistor PTX2, the storage transistor STX2, and a transfer transistor TX2. Because the configuration and function of the second tap TB are substantially similar to those of the first tap TA, redundant descriptions thereof are omitted.

A second photo gate signal PS2 applied to the phototransistor PTX2 of the second tap TB may have a phase difference of 180° from the first photo gate signal PS1 applied to the phototransistor PTX1 of the first tap TA. Accordingly, the phototransistor PTX1 of the first tap TA and the phototransistor PTX2 of the second tap TB may be alternately turned on and off.

As such, because the first tap TA and the second tap TB operate in response to the first photo gate signal PS1 and the second photo gate signal PS2, respectively, which have different phases, the first tap TA and the second tap TB may respectively discriminate and transmit charges, obtained by the charge collector CC, by 0° and 180° phases or by 90° and 270° phases.

The first read circuit RO1 may include a reset transistor RX1, a driving transistor DX1, and a selection transistor SX1.

The reset transistor RX1 may be connected between a conductive line to which a power voltage VDD is supplied and the floating diffusion node FD1. The reset transistor RX1 may be turned on in response to a reset signal RS. For example, when the reset transistor RX1 is turned on, photocharges accumulated in the floating diffusion node FD1 may be reset.

The driving transistor DX1 may be connected between the conductive line to which the power voltage VDD is supplied and the selection transistor SX1. A gate electrode of the driving transistor DX1 may be connected to the floating diffusion node FD1. The floating diffusion node FD1 may have a voltage according to charges stored therein, and the driving transistor DX1 may amplify and output the voltage of the floating diffusion node FD1. The driving transistor DX1 may be implemented as a source follower.

The selection transistor SX1 may be connected to the driving transistor DX1. The selection transistor SX1 may be turned on in response to a selection signal SEL and output a first output voltage VOUT1 received from the driving transistor DX1. The selection transistor SX1 may output the first output voltage VOUT1 to a column line to which pixels arranged in the same column are connected. The first output voltage VOUT1 may be transmitted to the ADC circuit 130 through a column interconnection line.

The second read circuit RO2 may include a reset transistor RX2, a driving transistor DX2, and a selection transistor SX2. The configuration and operation of the second read circuit RO2 are substantially similar to the configuration and operation of the first read circuit RO1, and thus, redundant descriptions thereof are omitted.

Photocharges output through the second tap TB may be stored in a floating diffusion node FD2, and the driving transistor DX2 may amplify and output the voltage of the floating diffusion node FD2. The selection transistor SX2 may be turned on in response to the selection signal SEL and output a second output voltage VOUT2 received from the driving transistor DX2.

Referring to FIG. 3B, the pixel PXb may include a charge collector CC, a drain shutter DS, a first tap TA, a second tap TB, a first read circuit RO1, and a second read circuit RO2. The configuration and operation of the pixel PXb will be described with a focus on differences from the configuration and operation of the pixel PXa of FIG. 3A.

In FIG. 3B, the charge collector CC may include a photoelectric conversion device PD and a phototransistor PTX. In some example embodiments, the photoelectric conversion device PD may be omitted. The phototransistor PTX may be turned on in response to a photo gate signal PS applied to the gate thereof and collect photocharges. Unlike in FIG. 3A, the photo gate signal PS may have an active level, for example, a high level, during an integration period.

The first tap TA may include a shutter transistor TGX1, a storage transistor STX1, and a transfer transistor TX1, and the second tap TB may include a shutter transistor TGX2, a storage transistor STX2, and a transfer transistor TX2. The shutter transistor TGX1 may be connected between the phototransistor PTX and the storage transistor STX1, and the shutter transistor TGX2 may be connected between the phototransistor PTX and the storage transistor STX2. The shutter transistor TGX1 of the first tap TA may be turned on or off in response to a first shutter control signal TGS1, and the shutter transistor TGX2 of the second tap TB may be turned on or off in response to a second shutter control signal TGS2. The shutter transistors TGX1 and TGX2 may be turned on to electrically connect the phototransistor PTX to storage devices (e.g., the storage transistors STX1 and STX2), respectively. The first shutter control signal TGS1 and the second shutter control signal TGS2 may be modulated signals, the first shutter control signal TGS1 may have the same phase as the modulated light EL in FIG. 1, and the second shutter control signal TGS2 may have a phase difference of 180° from the modulated light EL. Alternatively, the first shutter control signal TGS1 may have a phase difference of 90° from the modulated light EL in FIG. 1, and the second shutter control signal TGS2 may have a phase difference of 270° from the modulated light EL. Accordingly, the shutter transistor TGX1 of the first tap TA and the shutter transistor TGX2 of the second tap TB may be alternately turned on.

As such, because the first tap TA and the second tap TB operate in response to the first shutter control signal TGS1 and the second shutter control signal TGS2, respectively, which have different phases, the first tap TA and the second tap TB may respectively discriminate and transmit charges, obtained by the charge collector CC, by 0° and 180° phases or by 90° and 270° phases.

Figure 4:
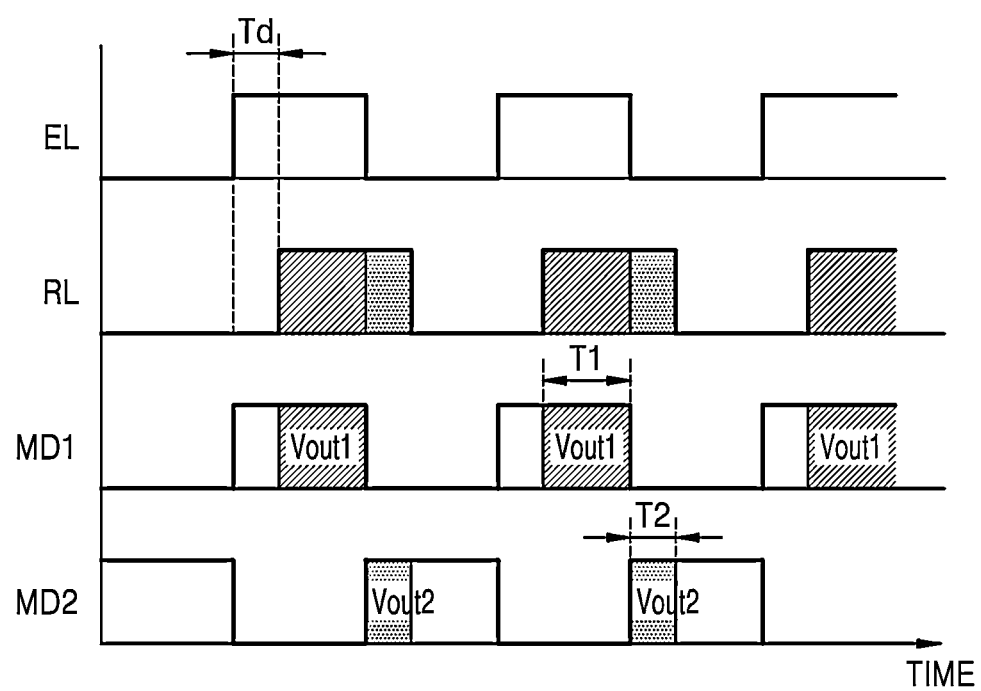
FIG. 4 is a timing diagram illustrating modulated signals applied to pixels of FIGS. 3A and 3B.

FIG. 4 is a timing diagram illustrating modulated signals applied to the pixels PXa and PXb of FIGS. 3A and 3B.

Referring to FIG. 4, with respect to the modulated light EL output from the light source 220 of FIG. 1, the reflected light RL reflected from the object OBJ of FIG. 1 and received by the image sensor 100 of FIG. 1 may be delayed by a delay time Td. The modulated light EL may be a pulsed light signal having a certain frequency. In some embodiments, the modulated light EL may have a frequency of about 10 MHz to about 100 MHz.

A first modulated signal MD1 may be a pulse voltage synchronized with the modulated light EL. A second modulated signal MD2 may be a pulse voltage having a certain phase difference from the modulated light EL. In some example embodiments, the phase difference may be 180°. The first modulated signal MD1 and the second modulated signal MD2 may be provided as the first photo gate signal PS1 and the second photo gate signal PS2 of FIG. 3A, or as the first shutter control signal TGS1 and the second shutter control signal TGS2 of FIG. 3B.

As a difference (T1−T2) between a time T1, during which a pulse signal of the reflected light RL and the first modulated signal MD1 overlap each other, and a time T2, during which the pulse signal of the reflected light RL and the second modulated signal MD2 overlap each other, increases, a measured distance (a distance to the object OBJ) may decrease. The first output voltage Vout1 may be generated during the time T1, during which the pulse signal of the reflected light RL and the first modulated signal MD1 overlap each other, and the second output voltage Vout2 may be generated during the time T2, during which the pulse signal of the reflected light RL and the second modulated signal MD2 overlap each other.

The image sensor 100 or an external processor may analyze a difference between the first output voltage Vout1 and the second output voltage Vout2 and determine a distance between the image sensor 100 and the object OBJ. For example, the distance between the image sensor 100 and the object OBJ may be determined by a two-phase algorithm analysis. The first output voltage Vout1 and the second output voltage Vout2 may be expressed not only as a single reflected light pulse signal but also as a sum of a plurality of reflected light pulse signals.

In some embodiments, in a first step, the first and second modulated signals MD1 and MD2 may respectively have phase differences of 0° and 180° from the modulated light EL, and in a second step, the first and second modulated signals MD1 and MD2 may respectively have phase differences of 90° and 270° from the modulated light EL.

The image sensor 100 or an external processor may analyze, with a 4-phase algorithm, a first output voltage Vout1 and a second output voltage Vout2, obtained in the first step, and a first output voltage Vout1 and a second output voltage Vout2, obtained in the second step, and determine the distance between the image sensor 100 and the object OBJ.

Figure 5A:
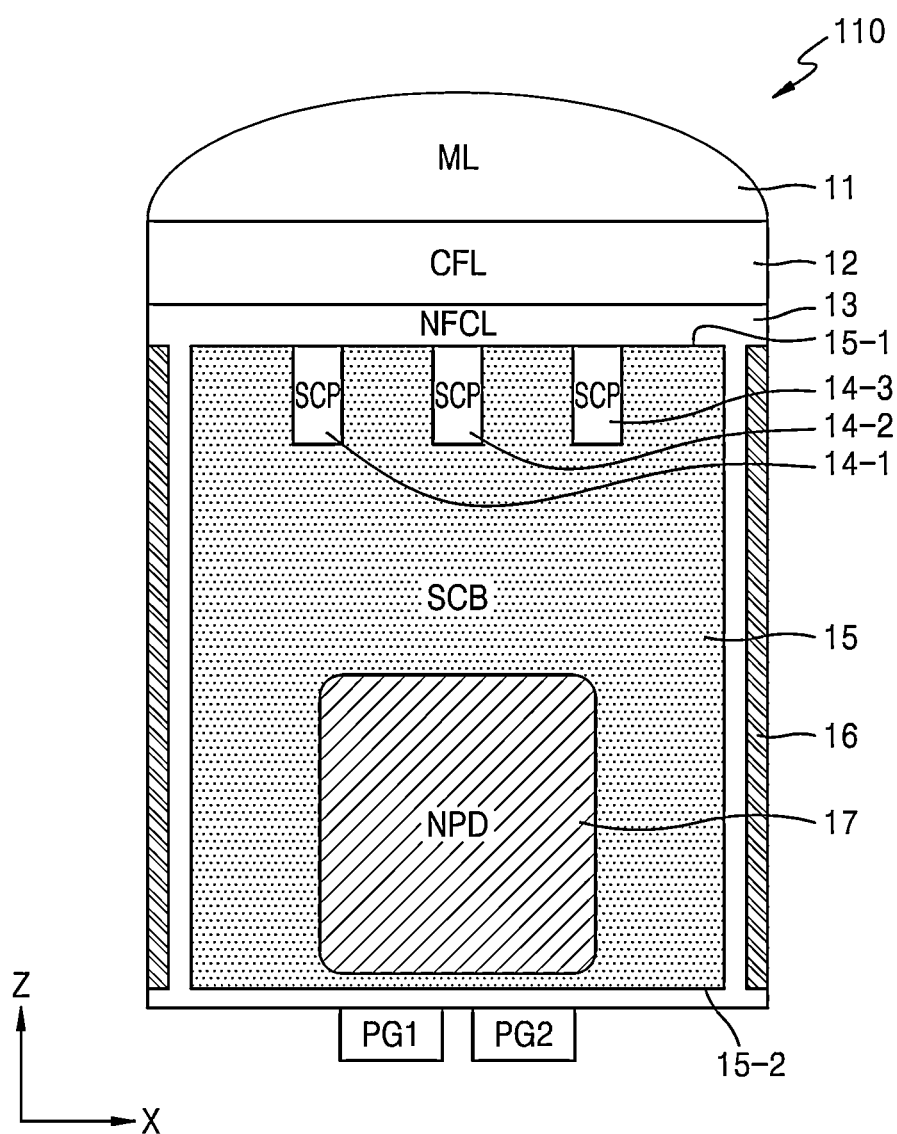
FIGS. 5A and 5B are a schematic cross-sectional view and a schematic plan view of a main part of a pixel provided in a pixel array according to some example embodiments.
Figure 5B:
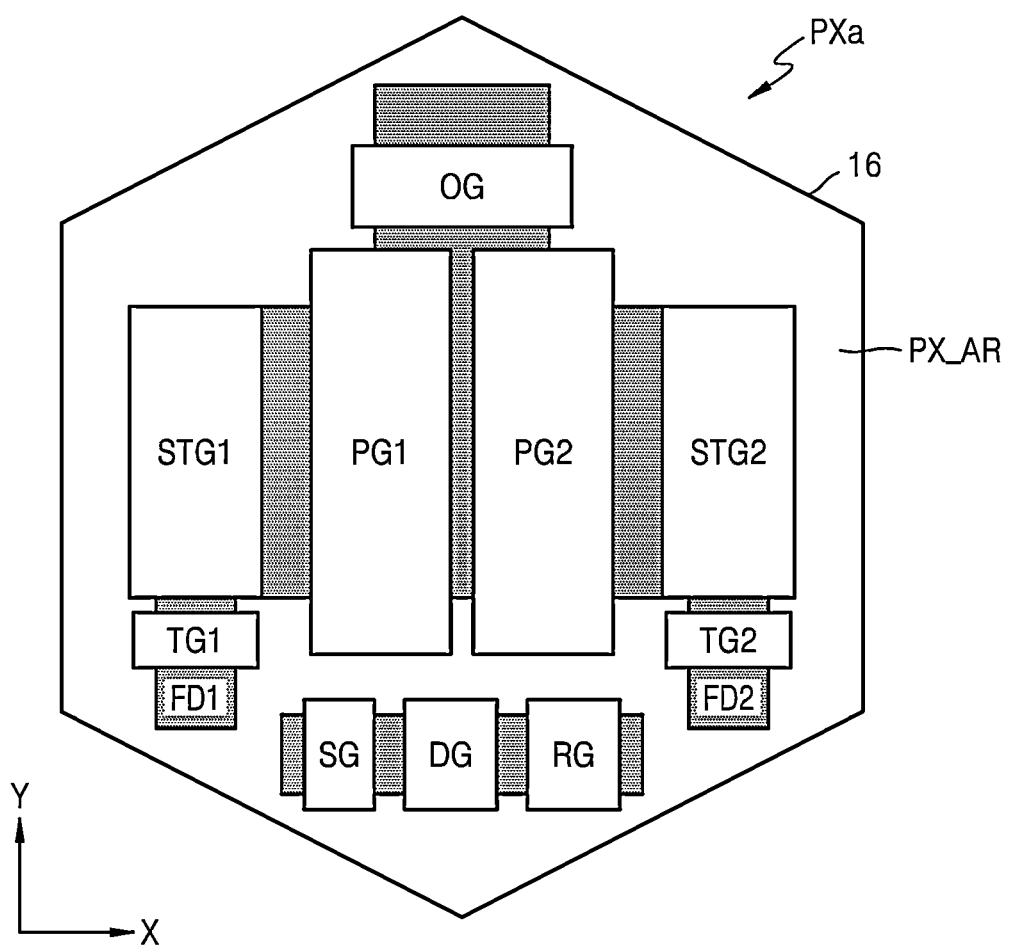

FIGS. 5A and 5B are a schematic cross-sectional view and a schematic plan view of a main part of a pixel provided in a pixel array according to some example embodiments. FIGS. 5A and 5B are a schematic cross-sectional view and a schematic plan view of the pixel PXa of FIG. 3A.

Referring to FIGS. 5A and 5B, a pixel array 110 may include a microlens 11, a color filter layer 12, a negative fixed charge layer 13, first to third sensitivity control members 14-1, 14-2, and 14-3, a semiconductor substrate 15, a DTI structure 16, a photoelectric conversion region 17, a first photo gate PG1, and a second photo gate PG2.

The microlens 11 may have an arc having a curvature and/or a vertical cross-sectional shape that is a part of an ellipse.

The color filter layer 12 may be arranged under the microlens 11. The color filter layer 12 may pass reflected light RL incident through the microlens 11 therethrough, and only light having a required wavelength may be incident on the photoelectric conversion region 17. The color filter layer 12 may be referred to as a color filter array. In some embodiments, the color filter layer 12 may be omitted to obtain only a color image, an infrared image, or a depth image.

The negative fixed charge layer 13 may be arranged under the color filter layer 12. The negative fixed charge layer 13 may include, for example, a high-k material such as HfOx, AlOx, or ZrOx.

The microlens 11, the color filter layer 12, and the negatively fixed charge layer 13 may be sequentially stacked on the semiconductor substrate 15. In some embodiments, the negative fixed charge layer 13 may directly contact the semiconductor substrate 15 and cover a first surface 15-1 of the semiconductor substrate 15. In some embodiments, a buffer layer may be further arranged between the microlens 11 and the negatively fixed charge layer 13.

The semiconductor substrate 15 may include a semiconductor, for example, at least one selected from among Si, Ge, SiGe, SiC, GaAs, InAs, and/or InP. In some example embodiments, the semiconductor substrate 15 may be of a first conductivity type. For example, the first conductivity type may be p-type. The semiconductor substrate 15 may include first to third sensitivity control members 14-1, 14-2, and 14-3 arranged on a surface in contact with the negative fixed charge layer 13. The first to third sensitivity control members 14-1, 14-2, and 14-3 may scatter the reflected light RL. Sensitivity to the reflected light RL may be increased by the first to third sensitivity control members 14-1, 14-2, and 14-3. Herein, three sensitivity control members (e.g., the first to third sensitivity control members 14-1, 14-2, and 14-3) are illustrated. However, example embodiments are not limited thereto. Each of the first to third sensitivity control members 14-1, 14-2, and 14-3 may have an uneven shape and may include an insulating material such as oxide, but is not limited thereto.

The deep trench isolator (DTI) structure 16 may be arranged on an outer side of the semiconductor substrate 15 and/or between a plurality of pixels. The DTI structure 16 may be (and/or include), for example, an insulator including oxide, nitride, oxynitride, and/or a combination thereof. In some embodiments, the DTI structure 16 may include a conductive material layer and a cover insulating layer surrounding the conductive material layer. For example, the conductive material layer may include polysilicon, metal, metal nitride, or oxide such as $SiO_2$, and the cover insulating layer may include oxide, nitride, oxynitride, or a combination thereof.

A part of the reflected light RL incident through the microlens 11 may travel toward the photoelectric conversion region 17. Another part of the reflected light RL incident through the microlens 11 may be scattered by the first to third sensitivity control members 14-1, 14-2, and 14-3, and then reflected back by the DTI structure 16. Accordingly, as a light path of the other part of the reflected light RL increases, an absorption rate in the photoelectric conversion region 17 may increase and sensitivity may increase.

The semiconductor substrate 15 may include the photoelectric conversion region 17, and the photoelectric conversion region 17 may be of a second conductivity type. For example, when the first conductive type is the p-type, the second conductivity type may be an n-type. The photoelectric conversion device PD may be formed by a PN junction between the photoelectric conversion region 17, which is of an n-type, and the semiconductor substrate 15, which is of a p-type.

The first photo gate PG1 and the second photo gate PG2 may be formed adjacent to a second surface 15-2 of the semiconductor substrate 15. The first photo gate PG1 and the second photo gate PG2 may be gates of the phototransistors PX1 and PX2 of FIG. 3A. In some example embodiment, the photoelectric conversion region 17 may be arranged on a portion of the first photo gate PG1 and a portion of the second photo gate PG2. Although not shown, an overflow gate OG, which is a gate of the overflow transistor OX in FIG. 3A, may be formed adjacent to the second surface 15-2 of the semiconductor substrate 15, and a photoelectric conversion region 17 may be arranged on at least a portion of the overflow gate OG.

Referring to FIG. 5B, the DTI structure 16 may separate a region (hereinafter, referred to as a pixel area) of the pixel PXa on a 2D plane. First and second photo gates PG1 and PG2, an overflow gate OG, first and second storage gates STG1 and STG2, first and second transfer gates TG1 and TG2, and first and second floating diffusion nodes FD1 and FD2 may be formed in a pixel area PX_AR. The first and second storage gates STG1 and STG2 may be gates of the storage transistors STX1 and STX2 in FIG. 3A, and the first and second transfer gates TG1 and TG2 may be gates of the transfer transistors TX1 and TX2 in FIG. 3A.

The first photo gate PG1, the first storage gate STG1, and the first transfer gate TG1 may form the first tap TA in FIG. 3A, and the second photo gate PG2, the second storage gate STG2, and the second transfer gate TG2 may form the second tap TB in FIG. 3A. The first photo gate PG1, the first storage gate STG1, and the first transfer gate TG1 may be formed symmetrically with the second photo gate PG2, the second storage gate STG2, and the second transfer gate TG2, respectively.

The first photo gate PG1 and the second photo gate PG2 may be formed in the center of the pixel area PX_AR, and the first storage gate STG1 and the second storage gate STG2 may be formed on sides of the first photo gate PG1 and the second photo gate PG2, respectively. The first transfer gate TG1 and the second transfer gate TG2 may be formed below or above the first storage gate STG1 and the second storage gate STG2, respectively. The first transfer gate TG1 and the second transfer gate TG2 may be connected to the first floating diffusion node FD1 and the second floating diffusion node FD2, respectively.

A reset gate RG, a driving gate DG, and a selection gate SG may be formed in the pixel area PX_AR. The reset gate RG, the driving gate DG, and the selection gate SG may be the gates of the reset transistor RX1 in FIG. 3A, the driving transistor DX1 in FIG. 3A, and the selection transistor SX1 in FIG. 3A, respectively. In an embodiment, some of the reset gate RG, the driving gate DG, and the selection gate SG may be formed in the pixel area PX_AR, or the reset gate RG, the driving gate DG, and the select gate SG may be formed outside the pixel area PX_AR.

Although one reset gate RG, one driving gate DG, and one selection gate SG are illustrated in FIG. 5B, a reset gate RG, a driving gate DG, and a selection gate SG corresponding to gates of the reset transistor RX2, the driving transistor DX2, and the selection transistor SX2, respectively, which are included in the second read circuit RO2 in FIG. 3A, may be further formed.

Figure 6A:
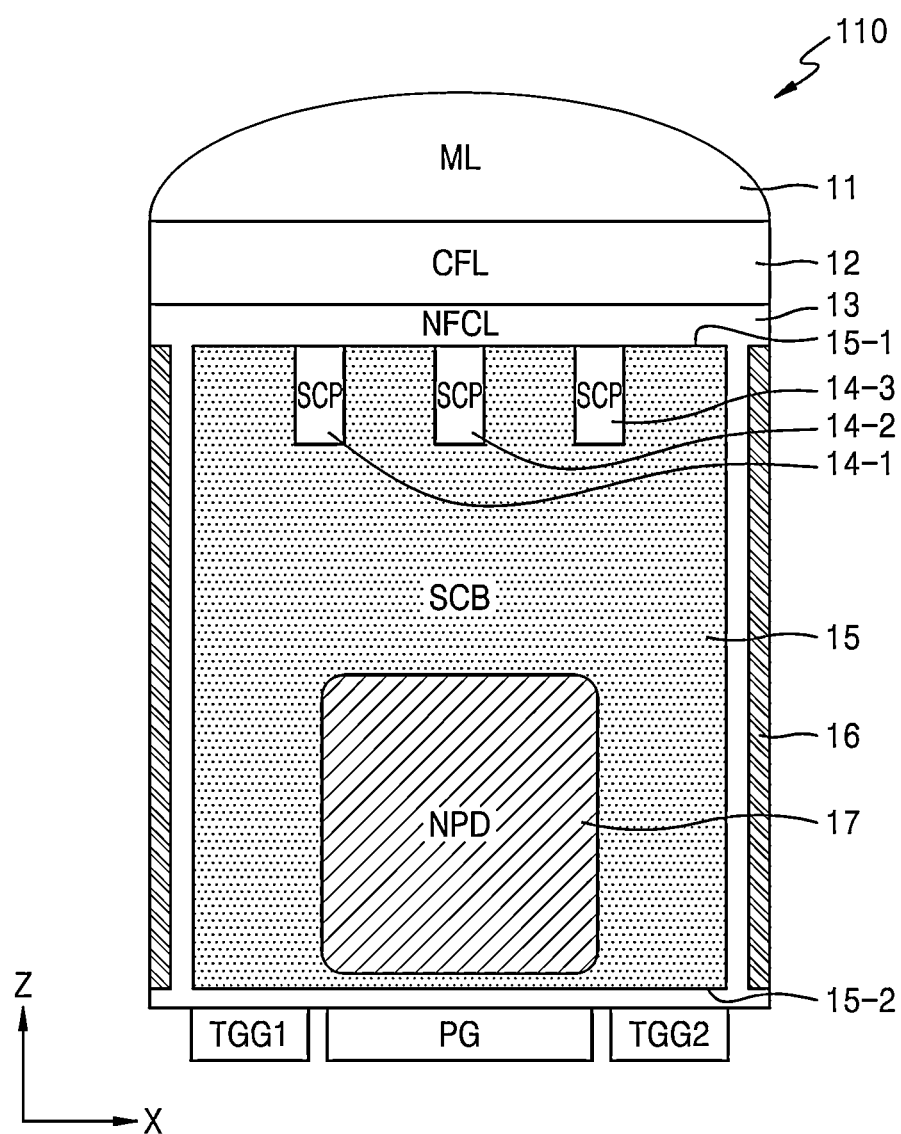
FIGS. 6A and 6B are a schematic cross-sectional view and a schematic plan view of a main part of a pixel provided in a pixel array according to some example embodiments.
Figure 6B:
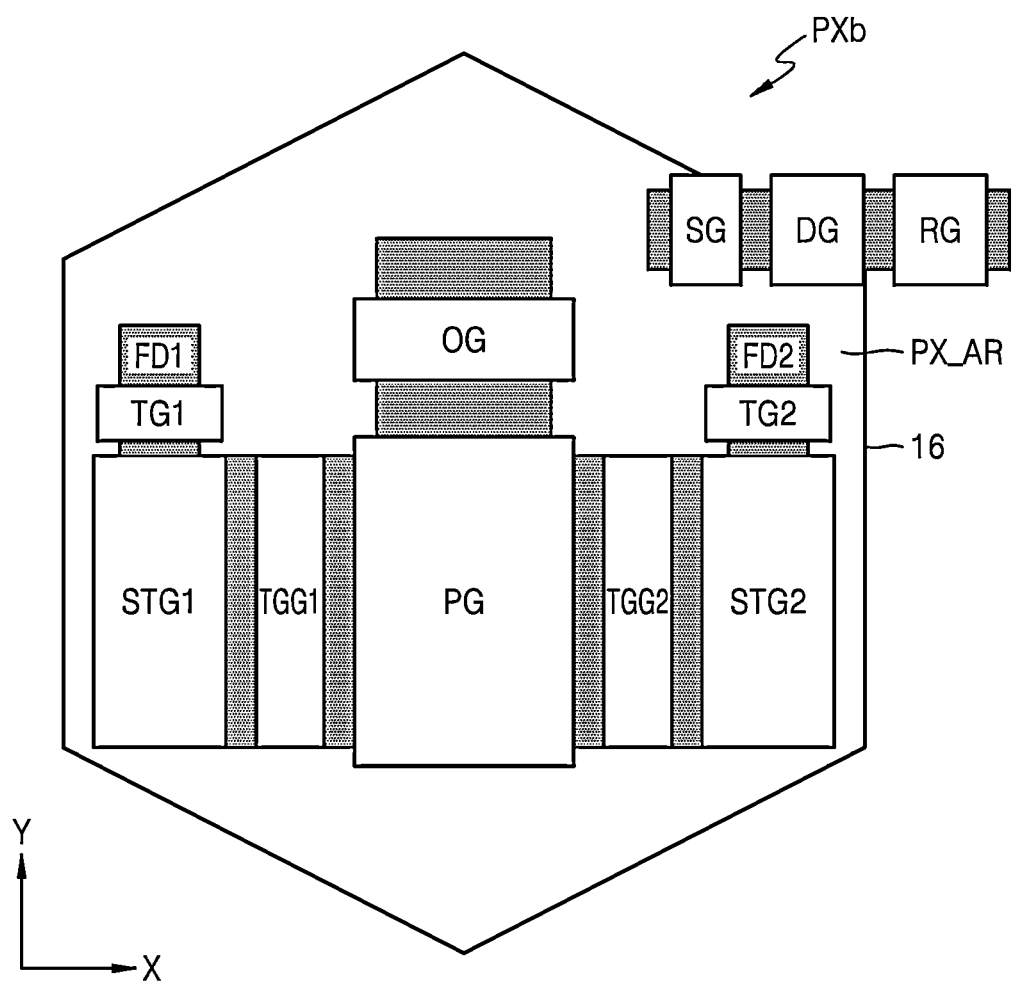

FIGS. 6A and 6B are a schematic cross-sectional view and a schematic plan view of a main part of a pixel provided in a pixel array according to some example embodiments. FIGS. 6A and 6B are a schematic cross-sectional view and a schematic plan view of the pixel PXb of FIG. 3B.

The cross-sectional and plan views of FIGS. 6A and 6B are similar to those of FIGS. 5A and 5B. Accordingly, descriptions of the same components are omitted.

Referring to FIG. 6A, a pixel array 110 may include a microlens 11, a color filter layer 12, a negative fixed charge layer 13, first to third sensitivity control members 14-1, 14-2, and 14-3, a semiconductor substrate 15, a DTI structure 16, a photoelectric conversion region 17, a photo gate PG, and first and second shutter gates TGG1 and TGG2.

The photo gate PG may be a gate of the phototransistor PTX of FIG. 3B, and the first and second shutter gates TGG1 and TGG2 may be gates of the shutter transistors TGX1 and TGX2 of FIG. 3B, respectively. The photo gate PG and the first and second shutter gates TGG1 and TGG2 may be formed adjacent to a second surface 15-2 of the semiconductor substrate 15. The photoelectric conversion region 17 may be formed on a portion of the photo gate PG, and the first and second shutter gates TGG1 and TGG2 may be respectively arranged on both sides of the photo gate PG.

Although not shown, an overflow gate OG, which is a gate of the overflow transistor OX in FIG. 3B, may be formed adjacent to the second surface 15-2 of the semiconductor substrate 15, and a photoelectric conversion region 17 may be arranged on at least a portion of the overflow gate OG.

Referring to FIG. 6B, the DTI structure 16 may define a pixel area PX_AR of the pixel PXa on a 2D plane. A photo gate PG, first and second shutter gates TGG1 and TGG2, an overflow gate OG, first and second storage gates STG1 and STG2, first and second transfer gates TG1 and TG2, and first and second floating diffusion nodes FD1 and FD2 may be formed in the pixel area PX_AR.

The first shutter gate TGG1, the first storage gate STG1, and the first transfer gate TG1 may form the first tap TA in FIG. 3A, and the second shutter gate TGG2, the second storage gate STG2, and the second transfer gate TG2 may form the second tap TB in FIG. 3A. The first shutter gate TGG1, the first storage gate STG1, and the first transfer gate TG1 and the second shutter gate TGG2 may be formed symmetrically with the second shutter gate TGG2, the second storage gate STG2, and the second transfer gate TG2, respectively.

The photo gate PG may be formed in the center of the pixel area PX_AR, and the first shutter gate TGG1 and the second shutter gate TGG2 may be respectively formed on both sides of the photo gate PG. The first storage gate STG1 and the second storage gate STG2 may be formed on sides of the first shutter gate TGG1 and the second shutter gate TGG2, respectively. The first transfer gate TG1 and the second transfer gate TG2 may be formed above or below the first storage gate STG1 and the second storage gate STG2, respectively, and a first floating diffusion node FD1 and a second floating diffusion node FD2 may also be formed above or below the first storage gate STG1 and the second storage gate STG2, respectively.

A reset gate RG, a driving gate DG, and a selection gate SG may be formed in the pixel area PX_AR, or some or all of the reset gate RG, the driving gate DG, and the selection gate SG may be formed outside the pixel area PX_AR.

Figure 7A:
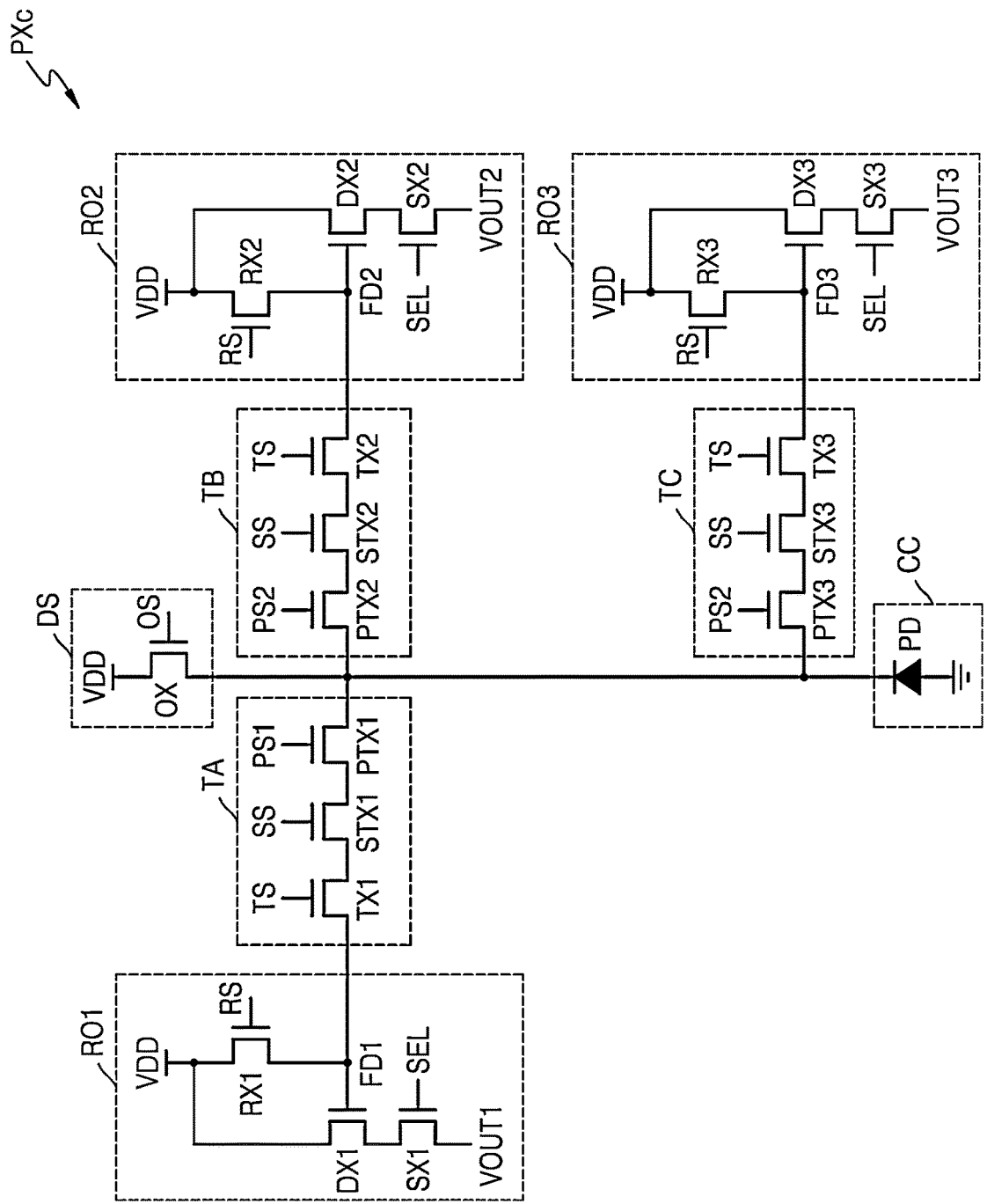
FIGS. 7A and 7B illustrate equivalent circuits of pixels according to some example embodiments.
Figure 7B:
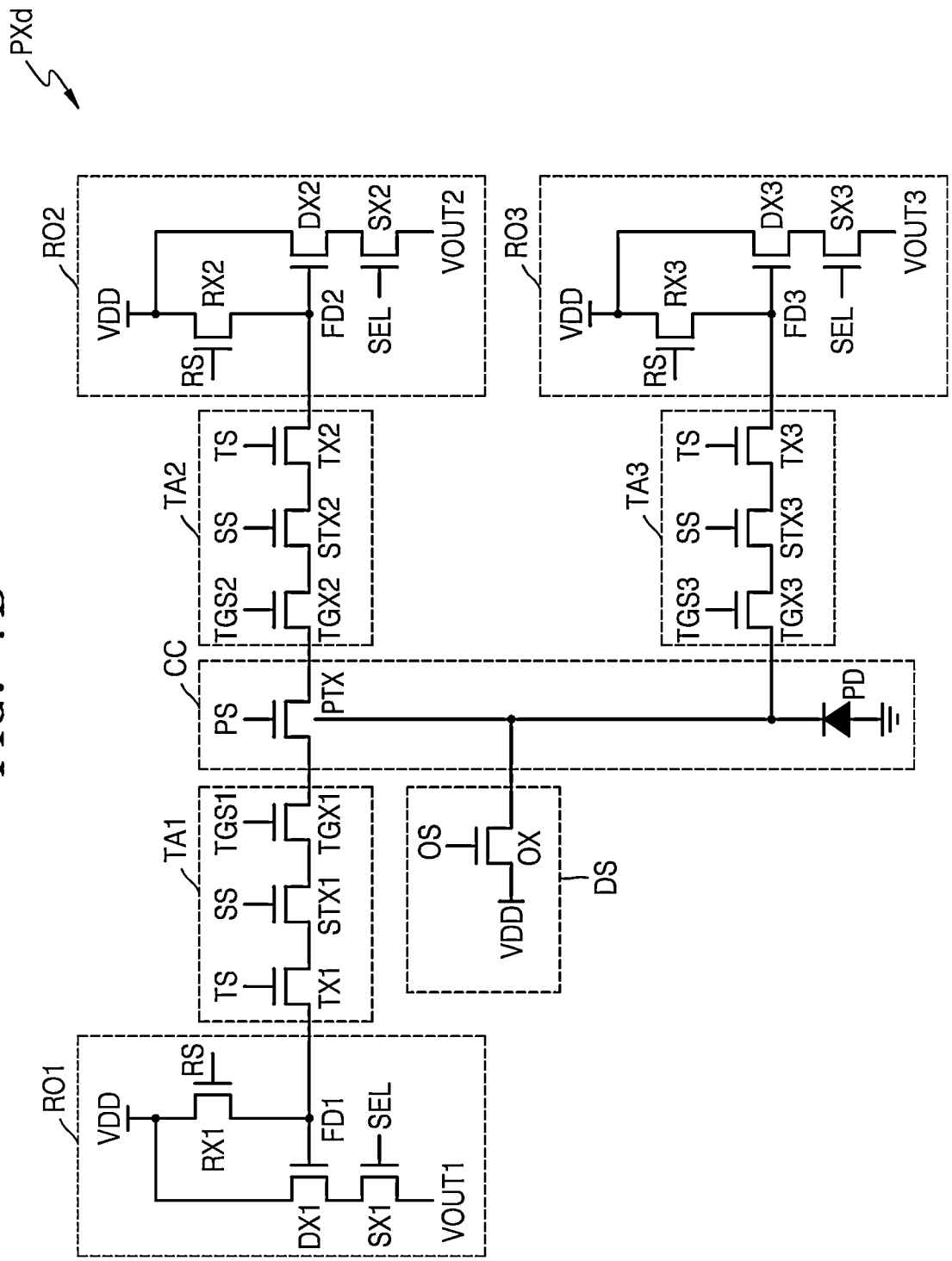

FIGS. 7A and 7B illustrate equivalent circuits of pixels according to some example embodiments. A pixel PXc of FIG. 7A and a pixel PXd of FIG. 7B may be applied as the pixels PX of FIGS. 1, 2A, and 2B.

FIG. 7A illustrates an equivalent circuit of a pixel PXc having a three-tap circuit structure of a photo gate modulation scheme, and FIG. 7B illustrates an equivalent circuit of a pixel PXd having a three-tap circuit structure of a static photo gate scheme. The image sensor 100 in FIG. 1 may implement a method of discriminating and transmitting charges by 0°, 120°, and 240° phases, the charges being generated according to a light signal received by the pixels PXc and PXd by using three taps.

The pixel PXc of FIG. 7A is a modified example of the pixel PXa of FIG. 3A, and differences therebetween are mainly described.

Referring to FIG. 7A, the pixel PXc may further include a third tap TC and a third read circuit RO3, compared to the pixel PXa of FIG. 3A. The third tap TC may include a phototransistor PTX3, a storage transistor STX3, and a transfer transistor TX3. The phototransistors PTX1, PTX2, and PTX3 of the first, second, and third taps TA, TB, and TC may be turned on or off in response to first, second, and third photo gate signals PS1, PS2, and PS3, respectively. As described above, the first, second, and third photo gate signals PX1, PX2, and PX3 may be modulated signals toggled during an integration period, and may have the same frequency as the modulated light EL of FIG. 1. The first photo gate signal PS1 may have the same phase as the modulated light EL, the second photo gate signal PS2 may have a phase difference of 120° from the modulated light EL, and the third photo gate signal PS3 may have a phase difference of 240° from the modulated light EL. Accordingly, the phototransistor PTX1 of the first tap TA, the phototransistor PTX2 of the second tap TB, and the phototransistor PTX3 of the third tap TC are sequentially turned on and off.

As such, because the first tap TA, the second tap TB, and the third tap TC operate in response to the first photo gate signal PS1, the second photo gate signal PS2, and the third photo gate signal PS3, respectively, which have different phases, the first tap TA, the second tap TB, and the third tap TC may respectively discriminate and transmit charges, obtained by the charge collector CC, by 0°, 120°, and 240° phases.

The third read circuit RO3 may include a reset transistor RX3, a driving transistor DX3, and a selection transistor SX3, and may output a third output voltage VOUT3. The operation of the third read circuit RO3 is the same as or similar to that of the first read circuit RO1 or the second read circuit RO2. In an embodiment, the pixel PXc may include one or two read circuits, and may share one or two read circuits with another neighboring pixel PXc.

The pixel PXd of FIG. 7B is a modified example of the pixel PXb of FIG. 3B. Therefore, differences therebetween are mainly described.

The pixel PXd may further include a third tap TC and a third read circuit RO3, compared to the pixel PXb of FIG. 3B. The third tap TC may include a shutter transistor TGX3, a storage transistor STX3, and a transfer transistor TX3. The shutter transistors TGX1, TGX2, and TGX3 of the first, second, and third taps TA, TB, and TC may be turned on or off in response to the first, second, and third shutter control signals TGS1, TGS2, and TGS3, respectively. The first, second, and third shutter control signals TGS1, TGS2, and TGS3 may be modulated signals toggled during an integration period, and may have the same frequency as the modulated light EL of FIG. 1. The first, second, and third shutter control signals TGS1, TGS2, and TGS3 may have phase differences of 0°, 120°, and 240°, respectively, from the modulated light EL. Accordingly, the shutter transistor TGX1 of the first tap TA, the shutter transistor TGX2 of the second tap TB, and the shutter transistor TGX3 of the third tap TC may be sequentially turned on and off.

As such, because the first tap TA, the second tap TB, and the third tap TC operate in response to the first, second, and third shutter control signals TGS1, TGS2, and TGS3, respectively, the first tap TA, the second tap TB, and the third tap TC may respectively discriminate and transmit charges, obtained by the charge collector CC, by 0°, 120°, and 240° phases.

The pixels PXc and PXd, each having a 3-tap circuit structure, have been described with reference to FIGS. 7A and 7B. However, the example embodiments are not limited thereto, and a pixel applied to the pixel array 110 of FIG. 1 may, for example, have an N-tap circuit structure (where N is an integer greater than or equal to 2). A plurality of modulated signals provided to N taps may have a phase difference of (360°/N).

FIGS. 8A, 8B, 8C, and 8D illustrate equivalent circuits of pixels according to some example embodiments. Pixels PXe, PXf, PXg, and PXh of FIGS. 8A to 8B may be applied as the pixels PX of FIGS. 1, 2A, and 2B.

Figure 8A:
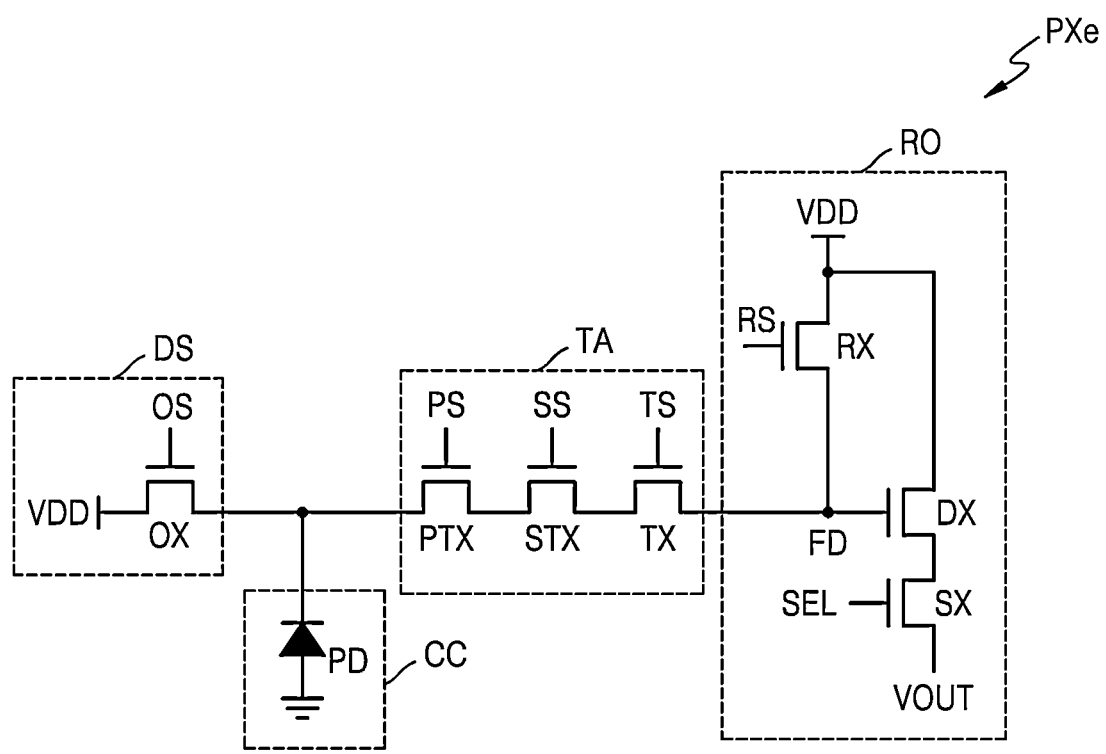
FIGS. 8A, 8B, 8C, and 8D illustrate equivalent circuits of pixels according to some example embodiments.
Figure 8B:
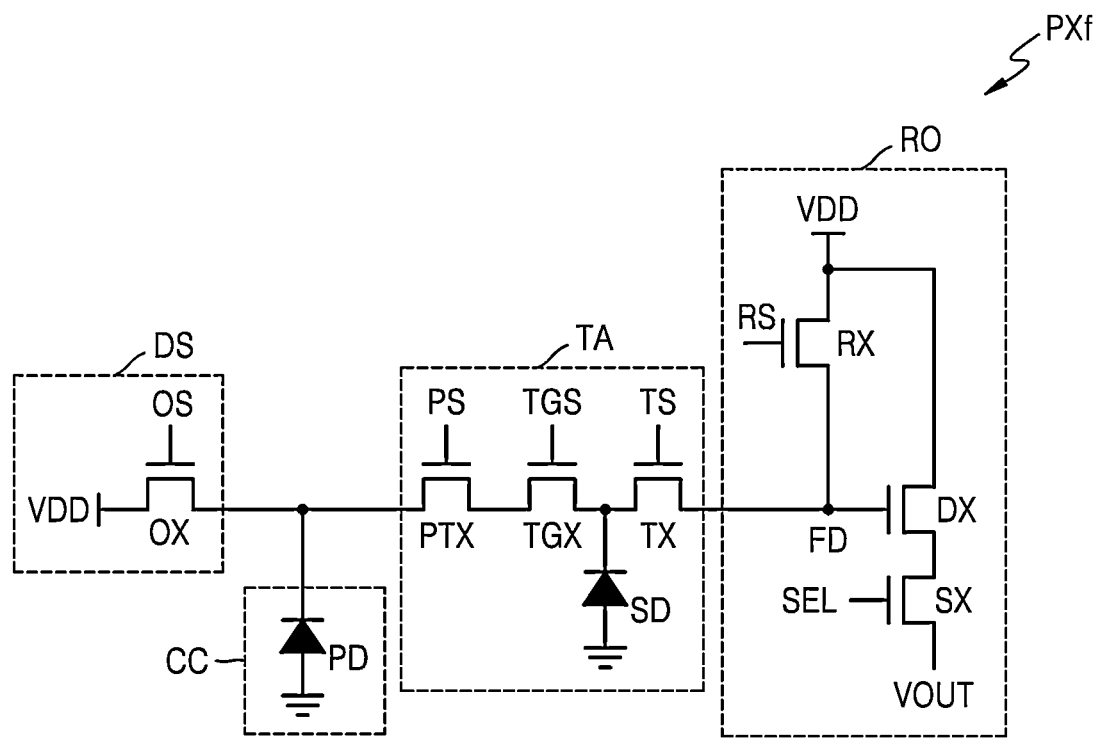
Figure 8C:
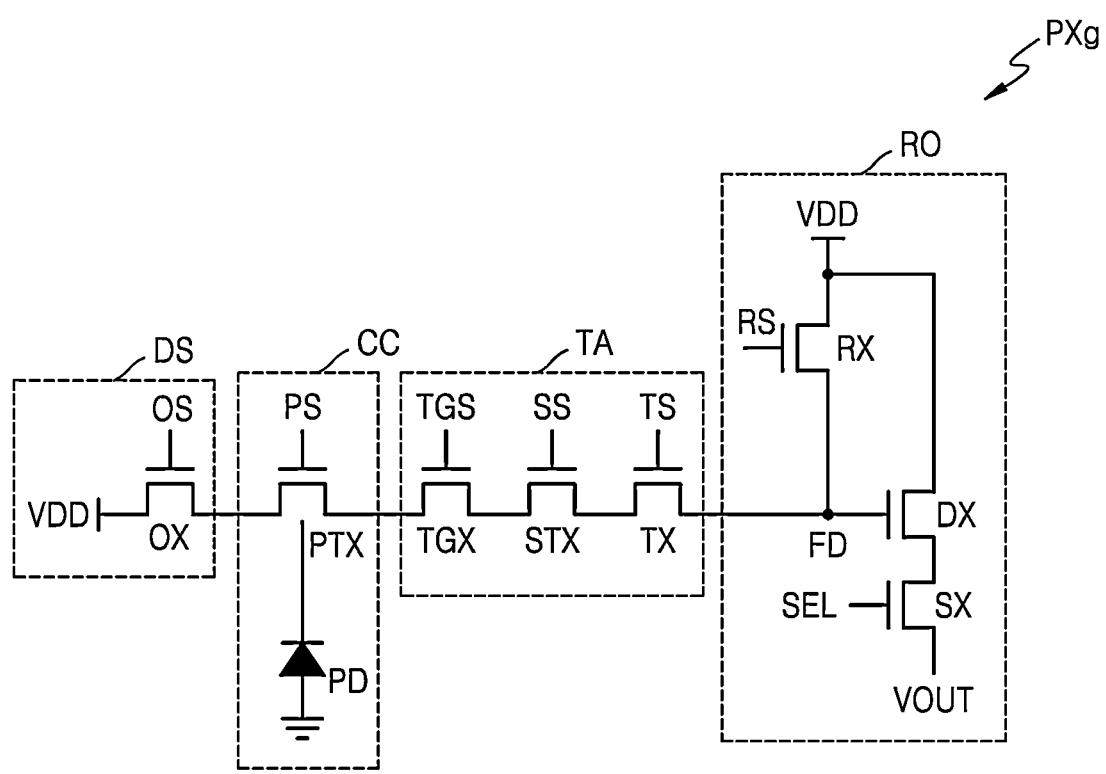
Figure 8D:
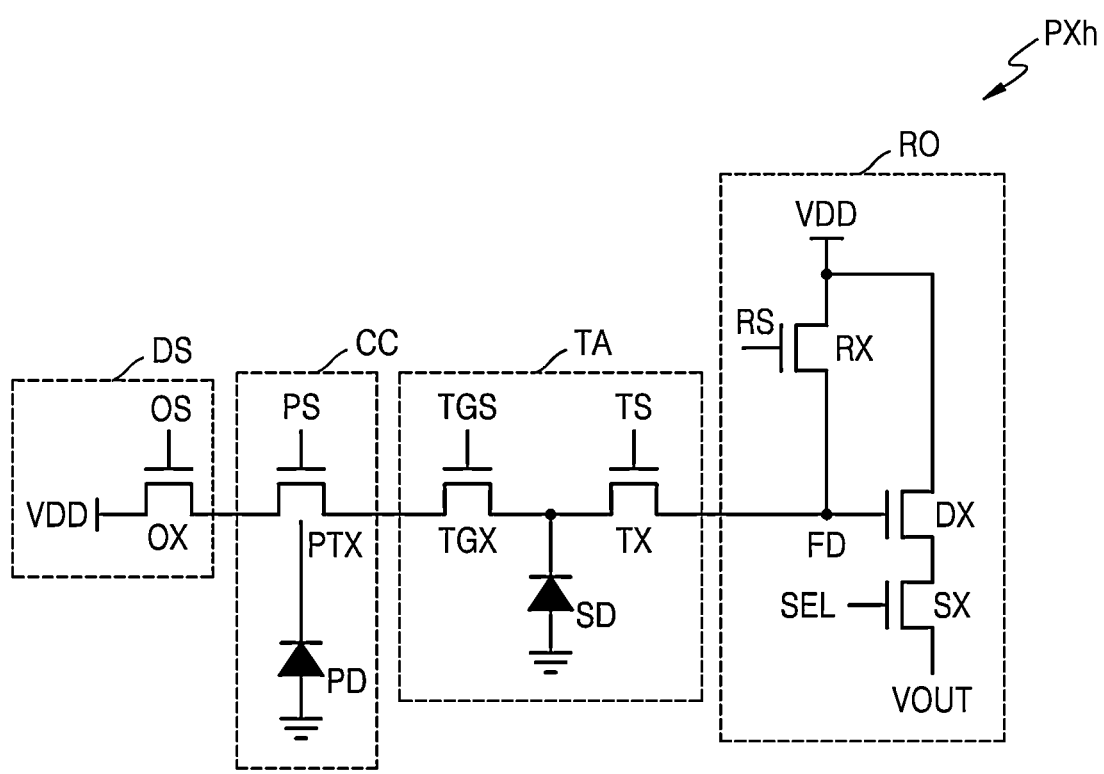

FIGS. 8A and 8B illustrate equivalent circuits of the pixels PXe and PXf each having a one-tap circuit structure of a photo gate modulation scheme, and FIGS. 8C and 8D illustrate equivalent circuits of the pixels PXg and PXh each having a one-tap circuit structure of a static photo gate scheme.

Referring to FIG. 8A, the pixel PXe may include a charge collector CC, a drain shutter DS, a tap TA, and a read circuit RO.

The charge collector CC may include a photoelectric conversion device CC, and the drain shutter DS may include an overflow transistor OX.

The tap TA may include a phototransistor PTX, a storage transistor STX, and a transfer transistor TX. Referring to FIG. 8B, in the tap TA, the storage transistor STX may be replaced with a shutter transistor TGX and a storage diode SD.

In an integration period, an overflow gate signal OS applied to the overflow transistor OX and a photo gate signal PS applied to the phototransistor PTX may be modulated signals, and the phase of the overflow gate signal OS may be opposite to the phase of the photo gate signal PS. For example, when the photo gate signal PS has the same phase as the modulated light EL of FIG. 1, the overflow gate signal OS may have a phase difference of 180° from the modulated light EL.

In some example embodiments, first to fourth modulated signals may be applied to the phototransistor PX as the photo gate signal PS. The first to fourth modulated signals may have a phase difference of 90° from each other. The overflow gate signal OS may have a phase difference of 180° from the photo gate signal PS applied to the phototransistor PTX. Alternatively, the overflow gate signal OS may maintain a constant level. A movement direction of charges generated in the charge collector CC may be determined by a voltage difference between the overflow gate signal OS and the first to fourth modulated signals.

In a read period after the integration period, the overflow transistor OX may be turned on, and the phototransistor PTX may be turned off to remove charges generated in the charge collector CC. In the read period, the transfer transistor TX may be turned on and transfer charges stored in the storage transistor STX to a floating diffusion node FD.

The read circuit RO may include a reset transistor RX, a driving transistor DX, and a selection transistor SX. The read circuit RO may amplify the voltage of the floating diffusion node FD and output the amplified voltage as an output voltage VOUT.

The pixels PXg and PXh of FIGS. 8C and 8D are modified examples of the pixels PXe and PXf of FIGS. 8A and 8B, respectively.

Referring to FIGS. 8C and 8D, the charge collector CC may include a phototransistor PTX and a photoelectric conversion device PD. In an embodiment, the photoelectric conversion device PD may be omitted. The phototransistor PTX may be turned on in response to a photo gate signal PS applied to the gate thereof and collect photocharges. The photo gate signal PS may have an active level, for example, a high level, during an integration period.

The tap TA may include a shutter transistor TGX, a storage transistor STX, and a transfer transistor TX. Referring to FIG. 8D, the storage transistor STX may be replaced with a storage diode SD.

In an integration period, an overflow gate signal OS applied to the overflow transistor OX and a shutter control signal TGS applied to the shutter transistor TGX may be modulated signals, and the phase of the overflow gate signal OS may be opposite to the phase of the shutter control signal TGS. For example, when the shutter control signal TGS has the same phase as the modulated light EL of FIG. 1, the overflow gate signal OS may have a phase difference of 180° from the modulated light EL.

In some example embodiments, first to fourth modulated signals may be applied to the shutter transistor TGX as the shutter control signal TGS. The first to fourth modulated signals may have a phase difference of 90° from each other. The overflow gate signal OS may have a phase difference of 180° from the shutter control signal TGS applied to the shutter transistor TGX. Alternatively, the overflow gate signal OS may maintain a constant level.

Figure 9A:
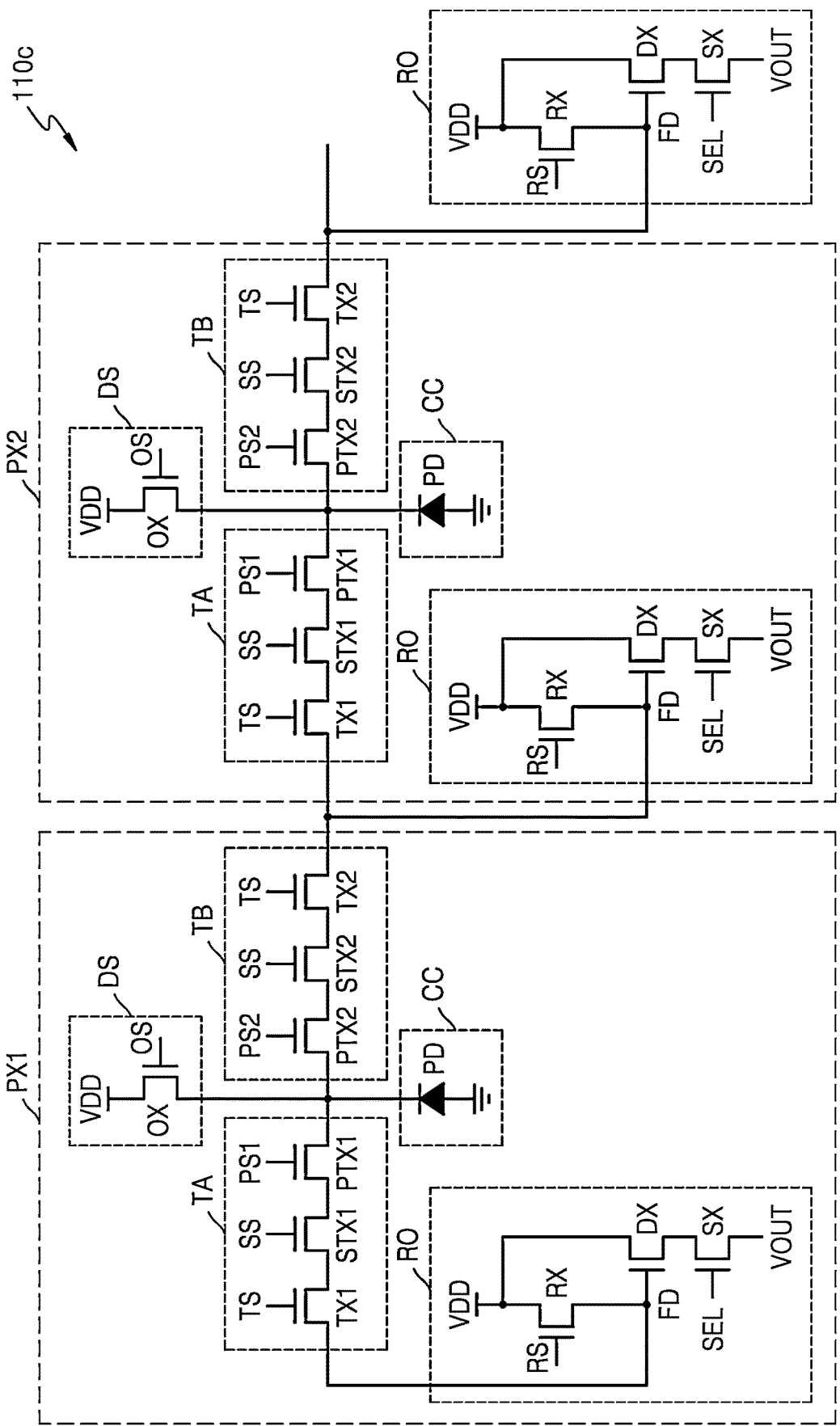
FIGS. 9A, 9B, and 9C illustrate implementations of pixel arrays according to some example embodiments.
Figure 9B:
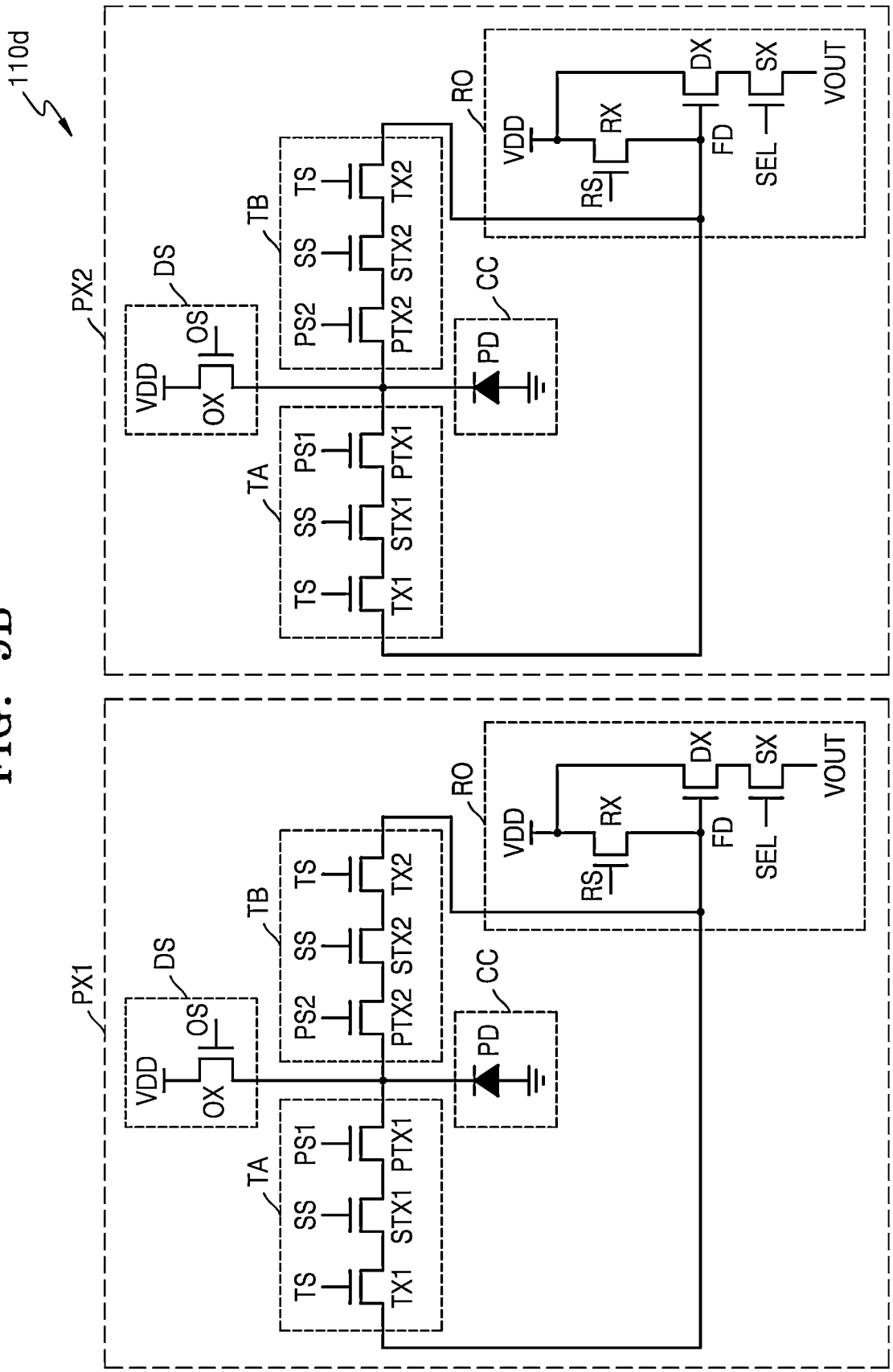
Figure 9C:
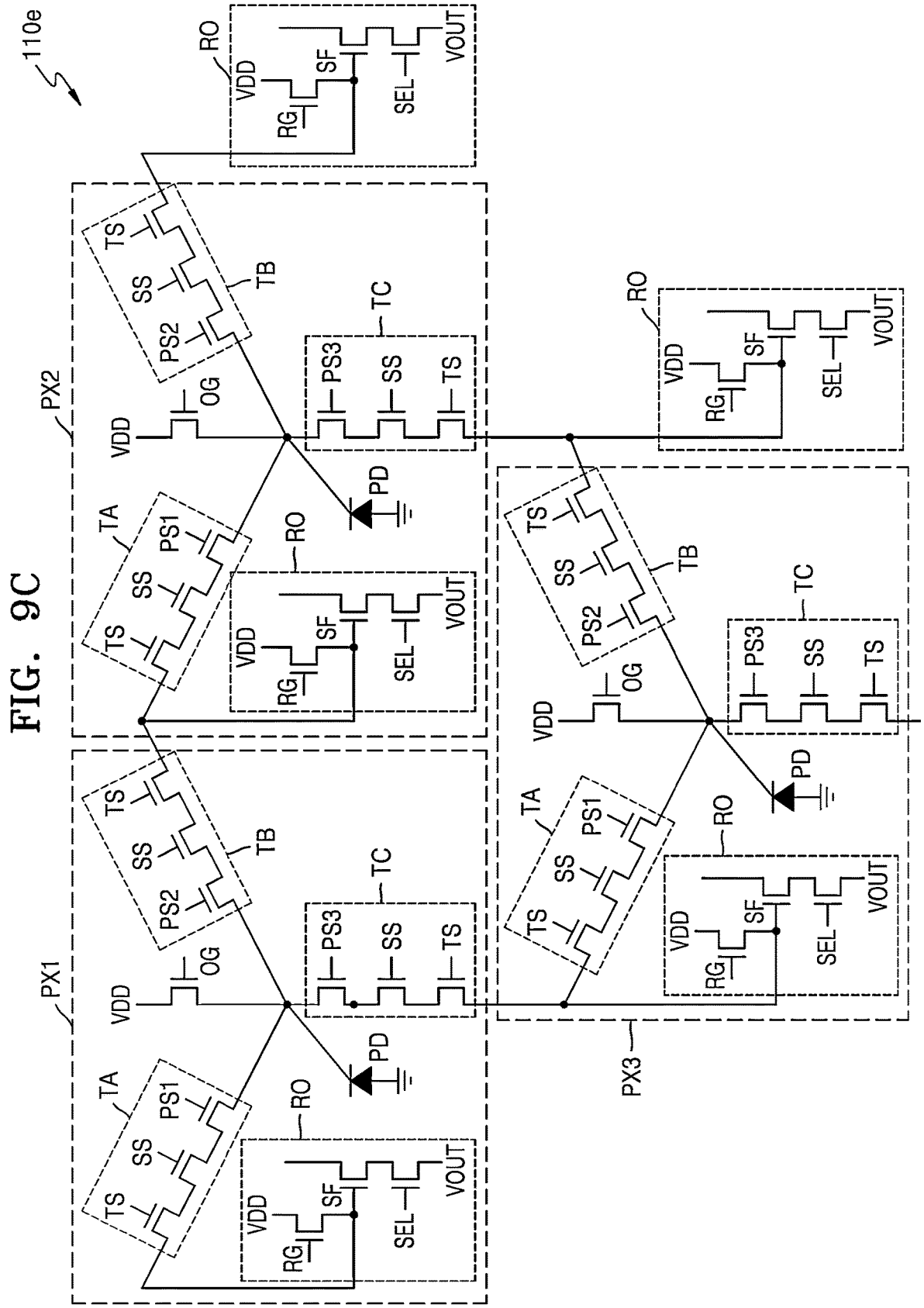

FIGS. 9A, 9B, and 9C illustrate implementations of pixel arrays according to some example embodiments. The pixels PXa to PXh according to the above-described various embodiments may be applied to, e.g., the pixel arrays 110c, 110d, and 110e of FIGS. 9A to 9C.

Referring to FIG. 9A, adjacent pixels of the pixel array 110c, for example, a first pixel PX1 and a second pixel PX2, may share a read circuit RO. Each of the first pixel PX1 and the second pixel PX2 may include a first tap TA and a second tap TB, and the second tap TB of the first pixel PX1 may share the read circuit RO with the first tap TA of the second pixel PX2. The second tap TB of the second pixel PX2 may share the read circuit RO with the first tap TA of another adjacent pixel.

A period in which charges generated in the first pixel PX1 is transferred to a shared read circuit RO, for example, the read circuit RO of the second pixel PX2, through the second tap TB of the first pixel PX1 may be different from a period in which charges generated in the second pixel PX2 is transferred to the shared read circuit RO through the first tap TA of the second pixel PX2. In other words, the second tap TB of the first pixel PX1 and the first tap TA of the second pixel PX2 may output charges to the read circuit RO shared in a time division manner Referring to FIG. 9B, each of a plurality of pixels of the pixel array 110d, for example, a first pixel PX1 and a second pixel PX2, may include one read circuit RO, and a first tap TA and a second tap TB sharing the read circuit RO.

Referring to FIG. 9C, adjacent pixels of the pixel array 110e, for example, a first pixel PX1, a second pixel PX2, and a third pixel PX3, may share a read circuit RO. Each of the first pixel PX1, the second pixel PX2, and the third pixel PX3 may include a first tap TA, a second tap TB, and a third tap TC. The second tap TB of the first pixel PX1 may share a read circuit RO of the first pixel PX2 with the first tap TA of the second pixel PX2, and/or the third tap TC of the first pixel PX1 may share a read circuit RO of the third pixel PX3 with the first tap TA of the third pixel PX3. The second tap TB and the third tap TC of each of the second pixel PX2 and the third pixel PX3 may also share a read circuit RO with adjacent pixels (not illustrated).

As described above, because each of the plurality of pixels includes the first tap TA, the second tap TB, and the third tap TC, three adjacent pixels may share a read circuit RO.

As described with reference to FIGS. 9A to 9C, because a read circuit may be shared within a pixel or between adjacent pixels, the sizes of pixels, that is, a layout area, may be reduced, and the size of the pixel array 110 in FIG. 1 may be reduced and the resolution thereof may be increased.

Figure 10A:
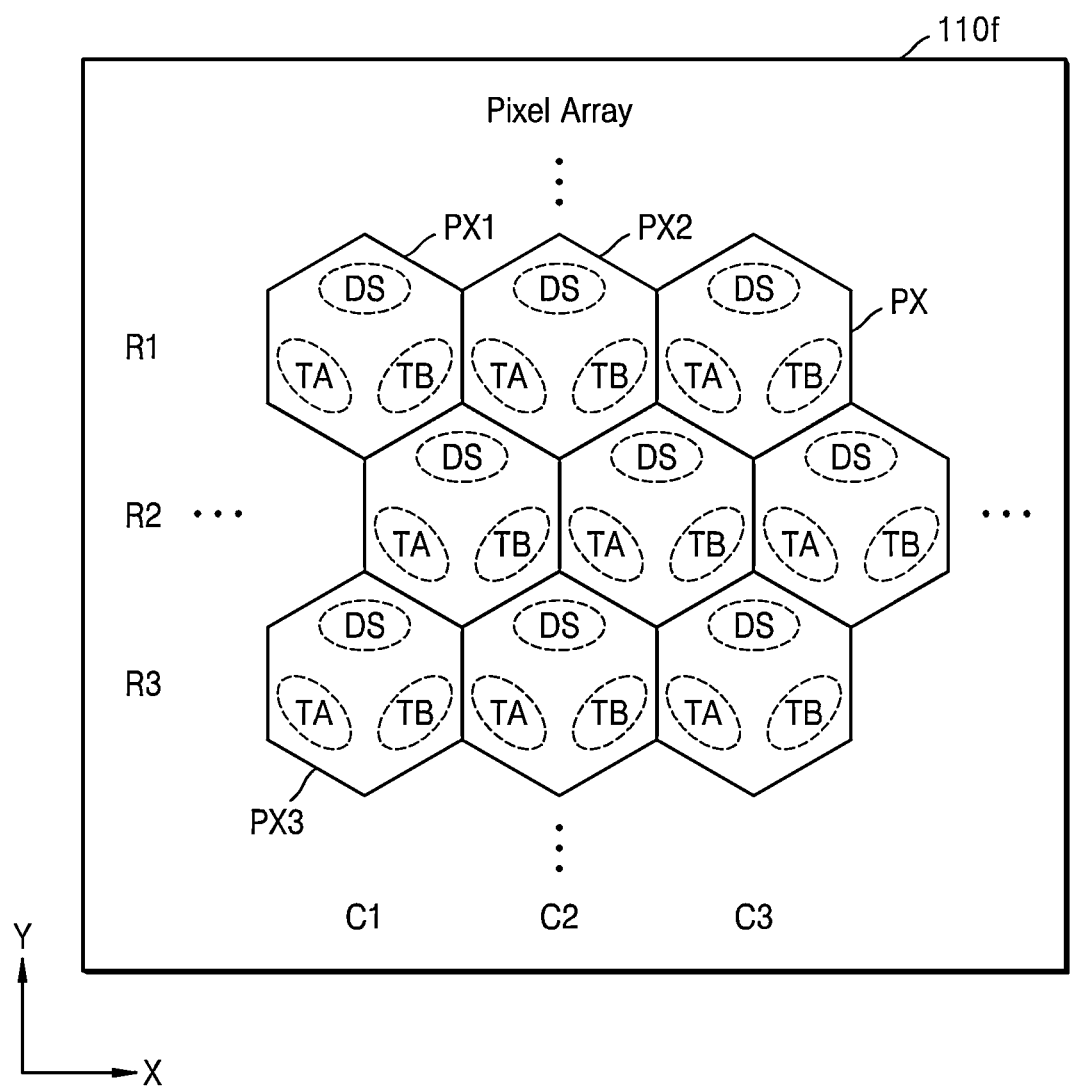
FIGS. 10A and 10B illustrate implementations of pixel arrays according to some example embodiments.
Figure 10B:
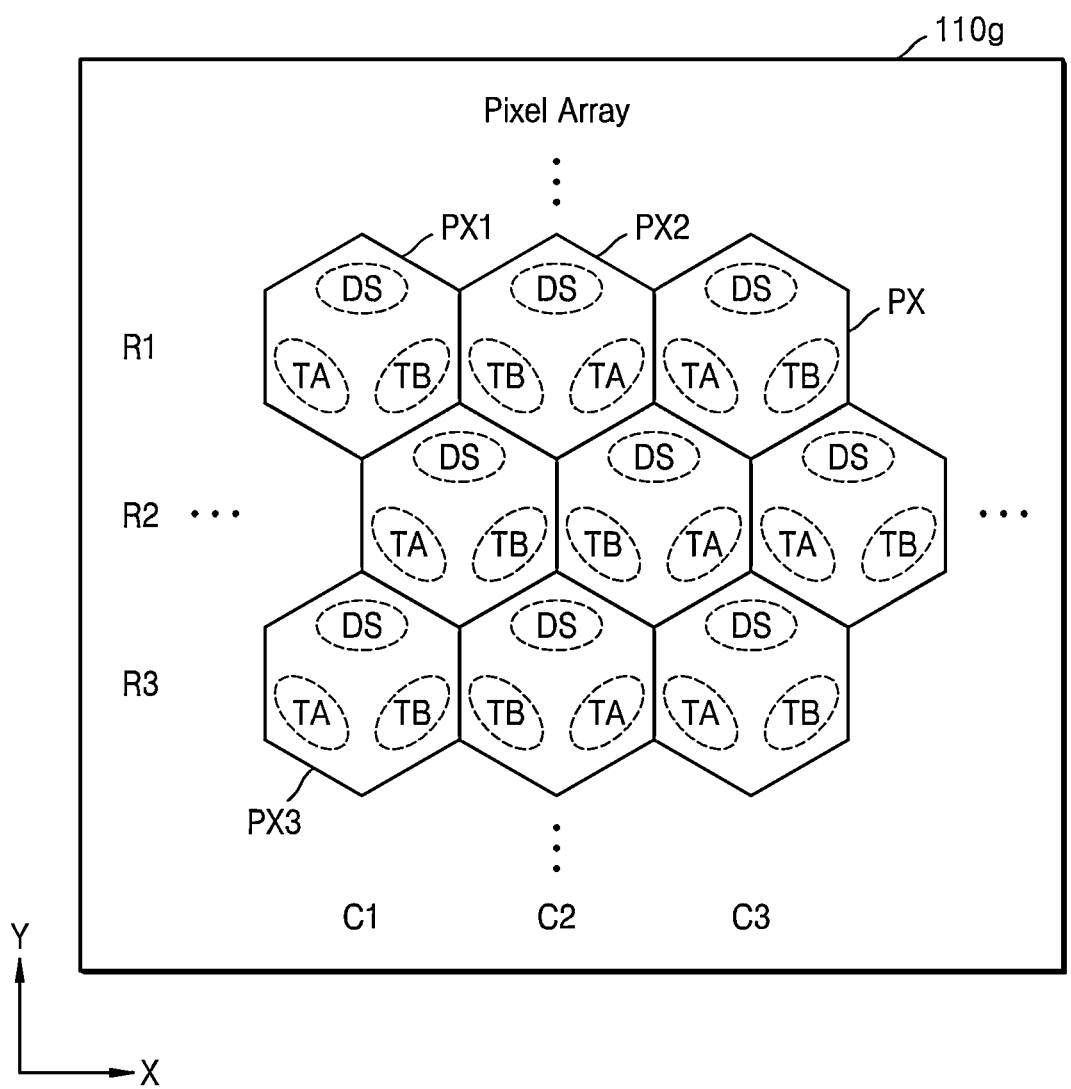

FIGS. 10A and 10B illustrate implementations of pixel arrays according to some example embodiments.

Referring to FIGS. 10A and 10B, each of a plurality of pixels PX in each of pixel arrays 110f and 110g may include a first tap TA and a second tap TB. Each of the plurality of pixels PX may further include other components, for example, a drain shutter DS.

Referring to FIG. 10A, in the plurality of pixels PX of the pixel array 110f, the first taps TA may be arranged at the same positions, and the second taps TB may also be arranged at the same positions. For example, the first tap TA may be arranged on the left in each of the pixels PX, and the second tap TB may be arranged on the right in each of the pixels PX. As such, the pixel array 110f may have a simple repeating structure of a two-tap circuit.

Referring to FIG. 10B, the first tap TA and the second tap TB in adjacent pixels PX of the pixel array 110g may be symmetrically arranged. For example, in a first pixel PX1, the first tap TA may be arranged on the left and the second tap TB may be arranged on the right, and in a second pixel PX2, the first tap TA may be arranged on the right and the second tap TB may be arranged on the left. As such, the pixel array 110g may have a phase-symmetric structure of a two-tap circuit.

Figure 11A:
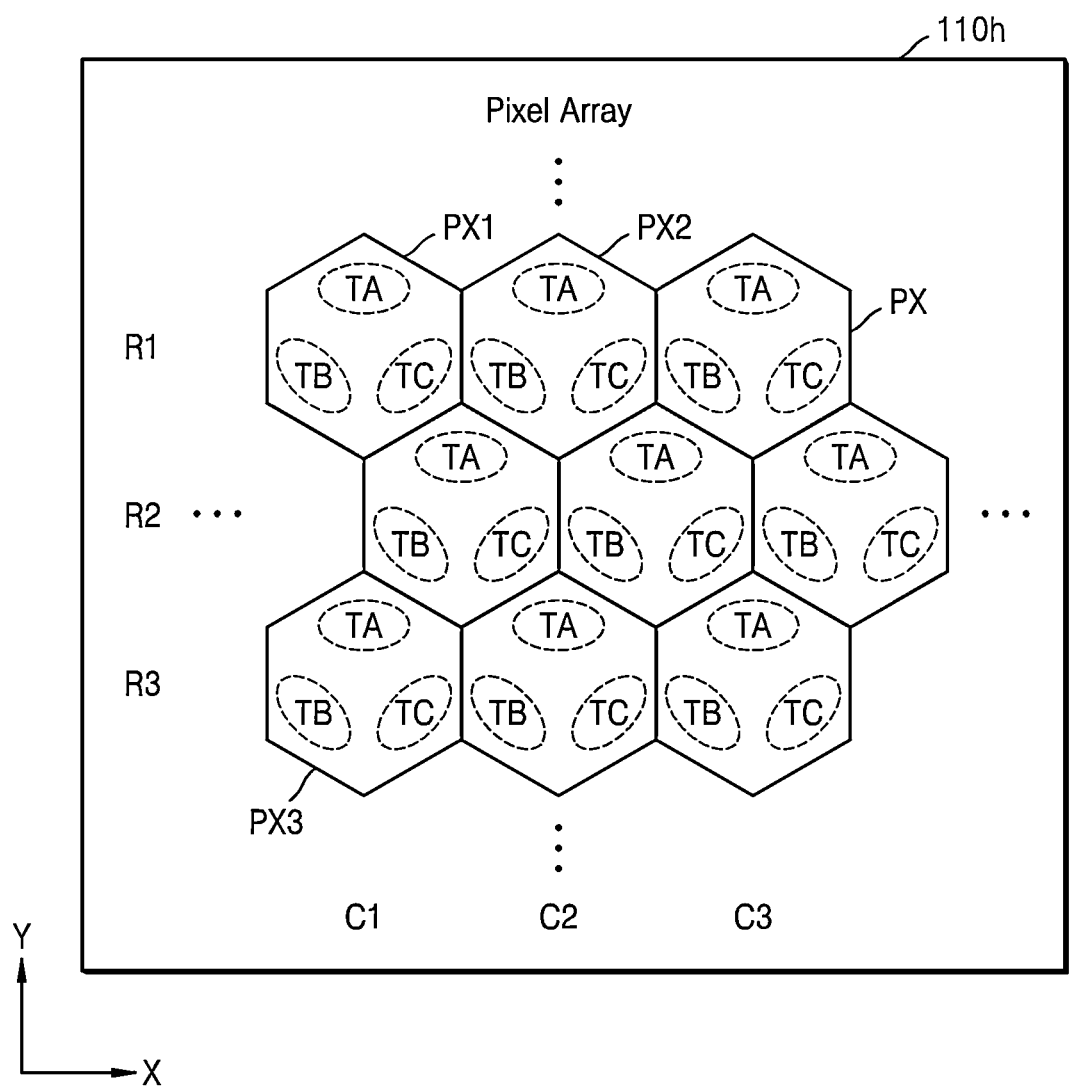
FIGS. 11A and 11B illustrate implementations of pixel arrays according to some example embodiments.
Figure 11B:
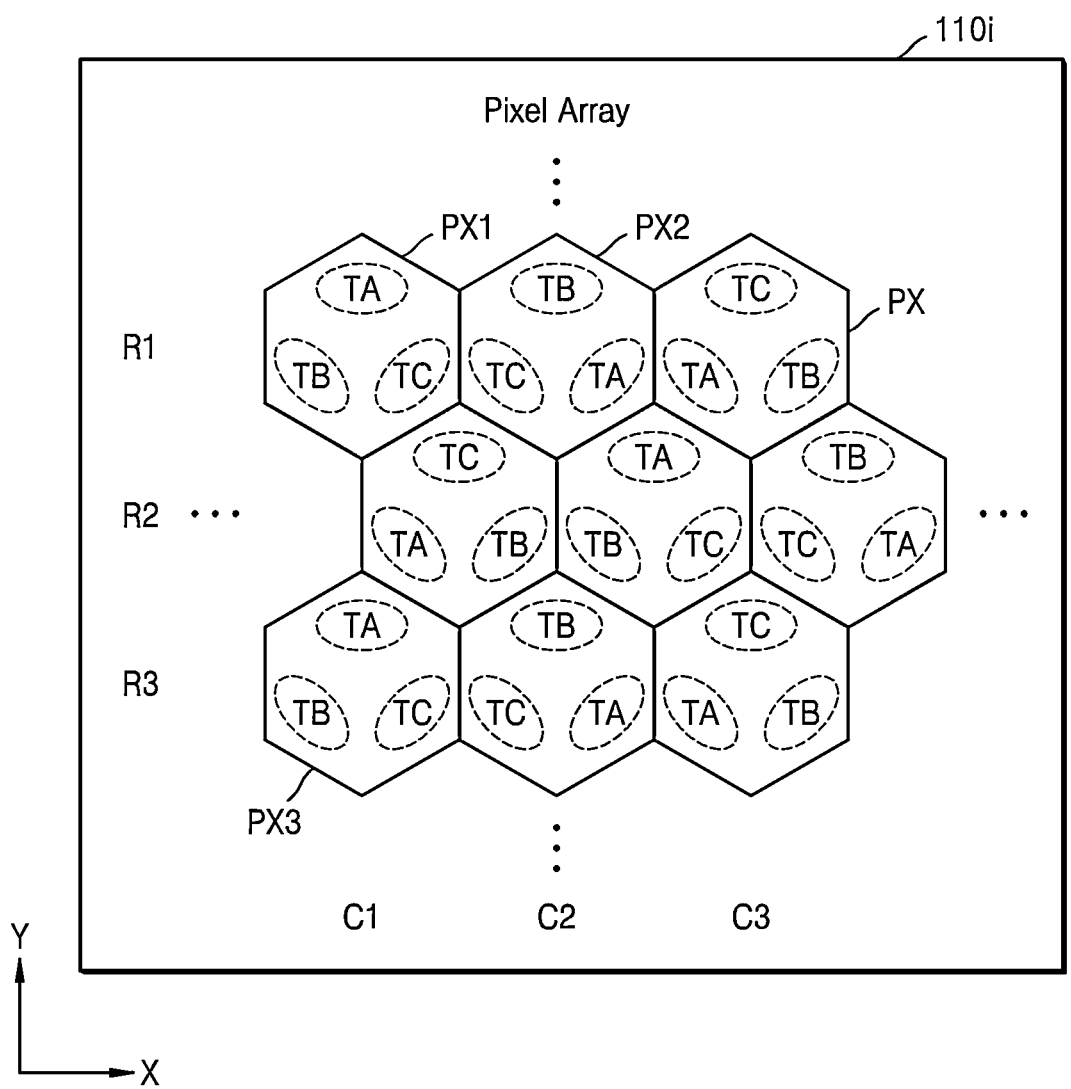

FIGS. 11A and 11B illustrate implementations of pixel arrays according to some example embodiments.

Referring to FIGS. 11A and 11B, each of a plurality of pixels PX in each of pixel arrays 110h and 110i may include a first tap TA, a second tap TB, and a third tap TC. Each of the plurality of pixels PX may further include other components, for example, a drain shutter.

Referring to FIG. 11A, the first taps TA, the second taps TB, and the third taps TC may be arranged at the same positions in the plurality of pixels PX. For example, in each of the plurality of pixels PX, a tap (e.g., the first tap TA) may be in an upper third, another tap (e.g., the second tap) may be in a left third, and the remainder tap (e.g., the third tap) may be in a right third. As such, the pixel array 110h may have a simple repeating structure of a three-tap circuit.

Referring to FIG. 11B, the first tap TA, the second tap TB, and the third tap TC in adjacent pixels PX of the pixel array 110g may be symmetrically arranged. For example, in some example embodiments, at an interface between three adjacent pixels, three of the first taps, three of the second taps, or three of the third taps may be arranged to be adjacent to each other. For example, in the first pixel PX1, the third tap TC may be arranged on the lower left, and in the second pixel PX2, the third tap TC may be arranged on the lower right. In addition, in the third pixel PX3, the third tap TC may be arranged on the top. Accordingly, the third taps TC of the first, second, and third pixels PX1, PX2, and PX3 may be arranged adjacent to each other. Similarly, first taps TA in three adjacent pixels PX may be arranged adjacent to each other, and second taps TB in three adjacent pixels PX may be arranged adjacent to each other. As such, the pixel array 110i may have a phase-symmetric structure of a three-tap circuit.

Figure 12A:
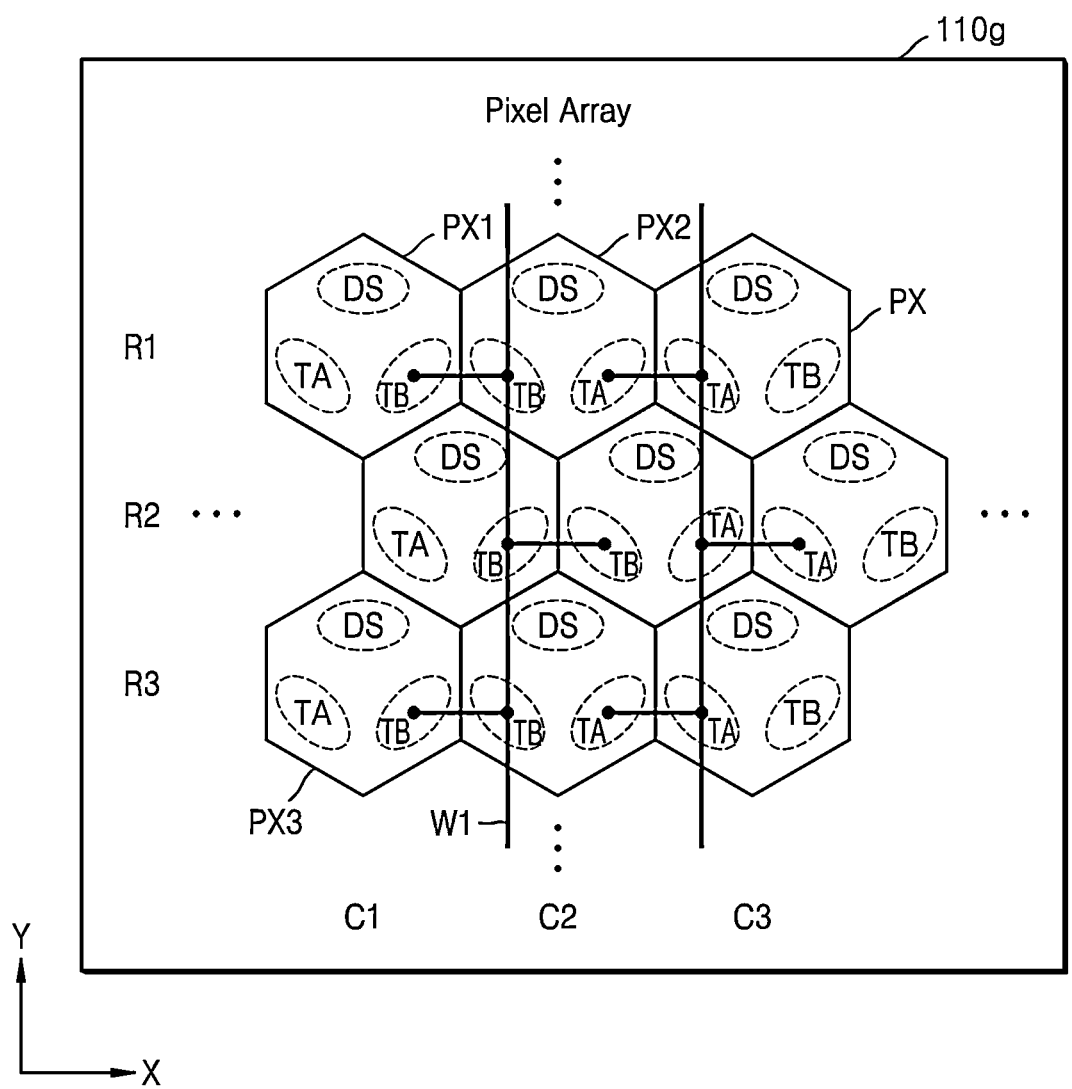
FIGS. 12A and 12B illustrate implementations of pixel arrays according to some example embodiments.
Figure 12B:
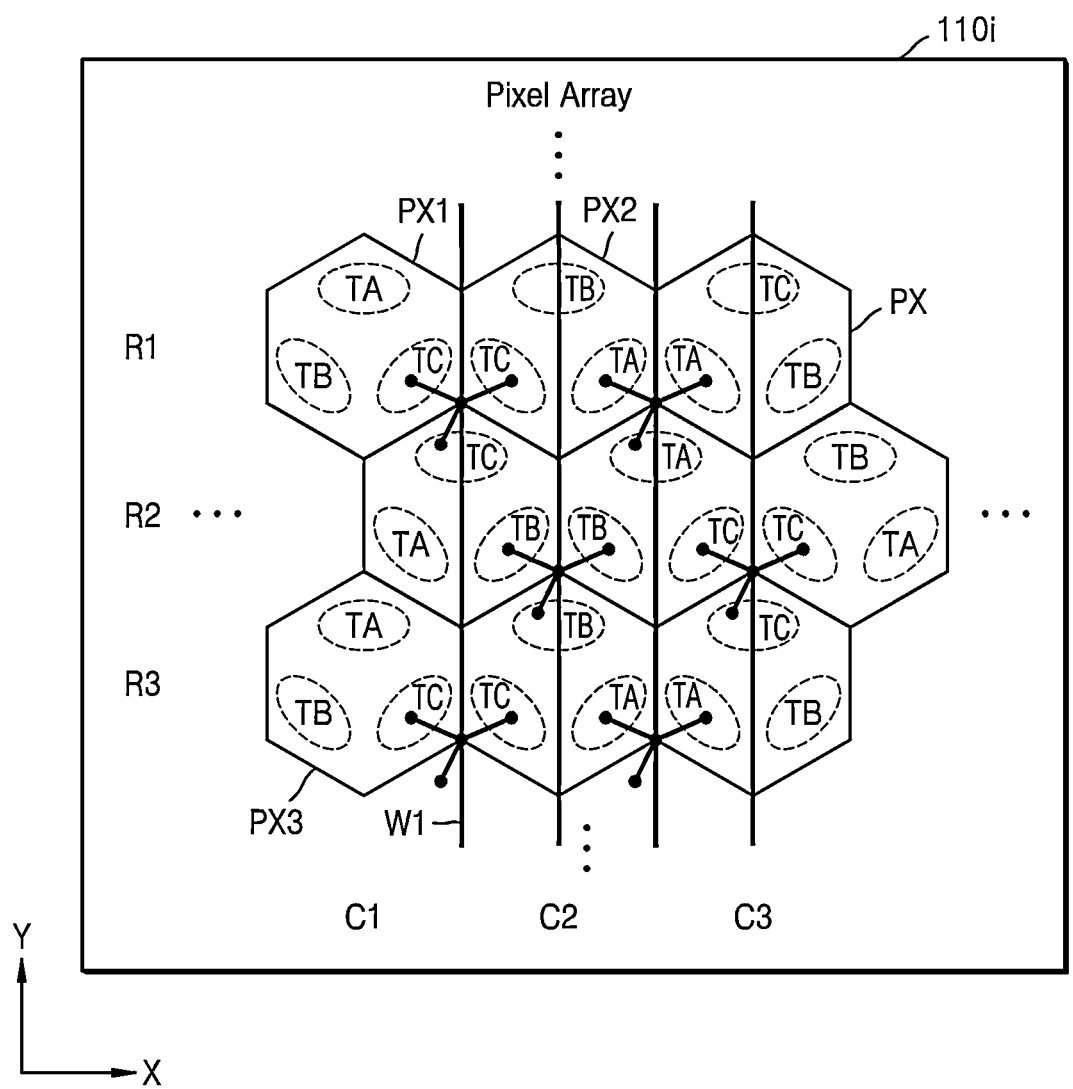

FIGS. 12A and 12B illustrate implementations of pixel arrays according to some example embodiments.

Referring to FIG. 12A, a pixel array 110g may have a phase-symmetric structure of a two-tap circuit, in which first taps TA of two pixels PX adjacent to each other in an X-axis direction may be connected to the same interconnection line, and second taps TB of two other pixels PX adjacent to each other in the X-axis direction may be connected to the same interconnection line. For example, a second tap TB of a first pixel PX1 and a second tap TB of a second pixel PX2 may be arranged adjacent to each other, and may be connected to a first interconnection line W1. The same control signal may be applied to the second taps TB of the first pixel PX1 and the second pixel PX2 through the first interconnection line W1. Although only a first interconnection line W1 for the second taps TB and an interconnection line for the first taps TA are illustrated in FIG. 12A, this is for convenience of description. A plurality of interconnection lines may be connected in common to the second taps TB of the first pixel PX1 and the second pixel PX2, and a plurality of control signals, for example, a second photo gate signal, a storage control signal, and a transmission control signal, may be applied through the plurality of interconnection lines, respectively.

Referring to FIG. 12B, a pixel array 110i may have a phase-symmetric structure of a three-tap circuit, in which first taps TA of three adjacent pixels PX may be connected to the same interconnection line, second taps TB of three other adjacent pixels PX may be connected to the same interconnection line, and third taps TC of three other adjacent pixels PX may be connected to the same interconnection line. For example, third tabs TC of a first pixel PX1, a second pixel PX2, and a third pixel PX3 may be arranged adjacent to each other and may be connected to a first interconnection line W1. The same control signal may be applied to the third taps TC of the first pixel PX1, the second pixel PX2, and the second pixel PX3 through the first interconnection line W1. The first interconnection line W1 may include a plurality of interconnection lines, and a plurality of control signals, for example, a third photo gate signal, a storage control signal, and a transmission control signal, may be applied to the third taps TC of the first pixel PX1, the second pixel PX2, and the third pixel PX3 through the plurality of interconnection lines, respectively.

As described with reference to FIGS. 12A and 12B, when each of the pixel arrays 110g and 110i has a phase-symmetric structure of a plurality of tabs, tabs having the same phase between adjacent pixels PX may be connected to the same interconnection line, and may receive a control signal through the same interconnection line. Accordingly, the number of interconnection lines for transmitting a control signal may be reduced.

Figure 13A:
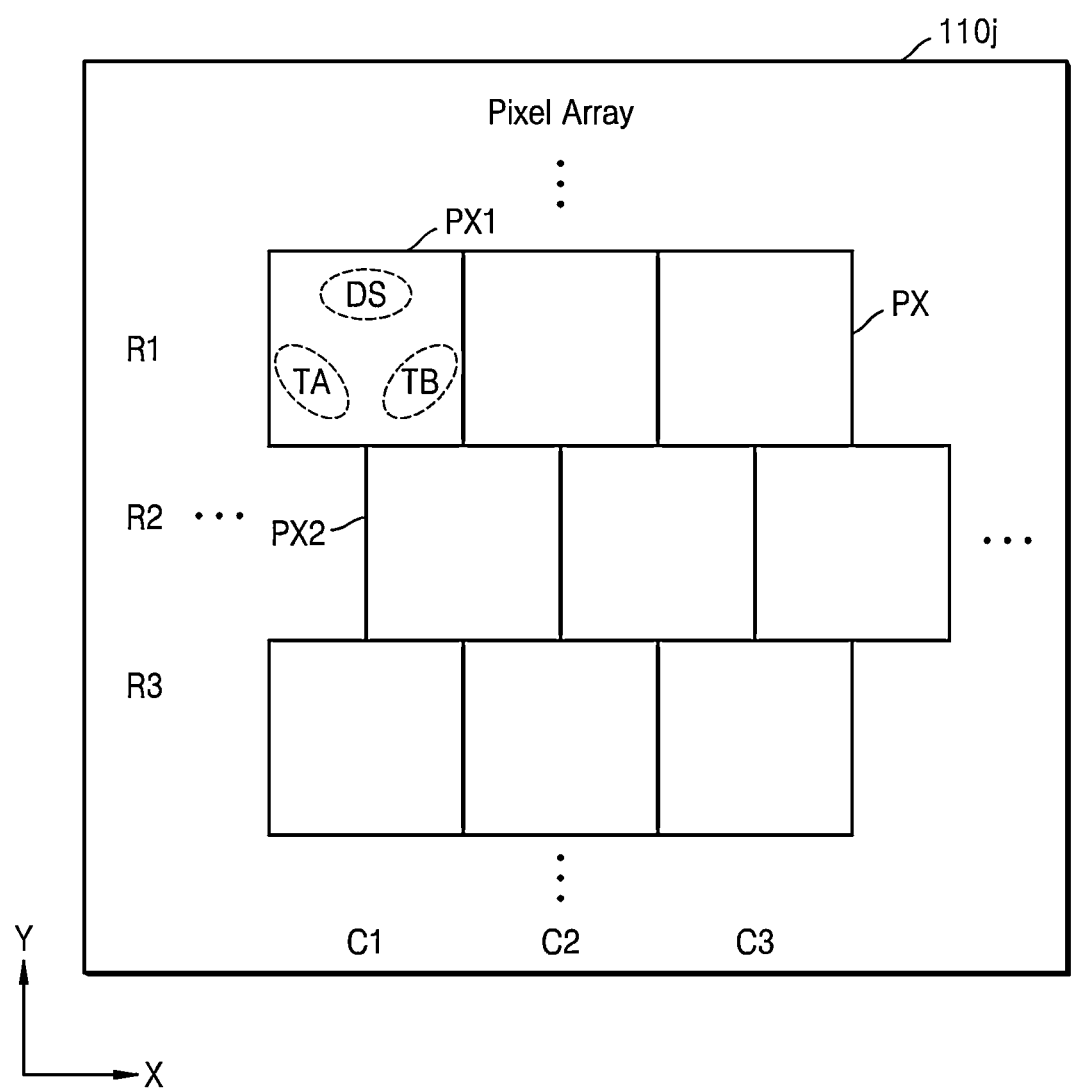
FIGS. 13A and 13B illustrate implementations of pixel arrays according to some example embodiments.
Figure 13B:
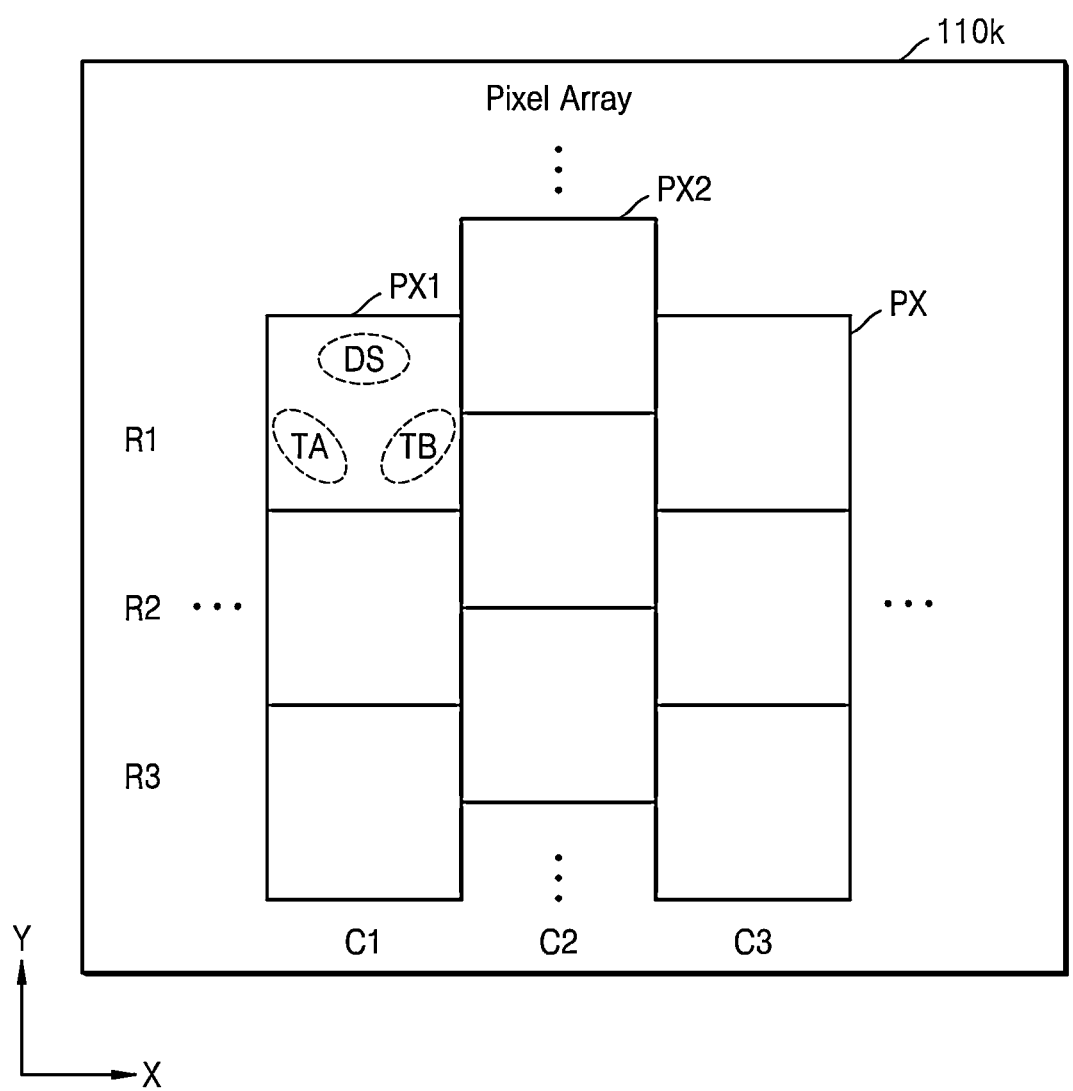

FIGS. 13A and 13B illustrate implementations of pixel arrays according to some example embodiments. A pixel array 110j of FIG. 13A and a pixel array 110k of FIG. 13B may be applied as the pixel array 110 of FIG. 1.

Referring to FIGS. 13A and 13B, each of the pixel arrays 110j and 110k may include a plurality of pixels PX arranged in a plurality of rows, such as first, second, and third rows R1, R2, and R3, and a plurality of columns, such as first, second, and third columns C1, C2, and C3.

Each of the plurality of pixels PX may include a plurality of taps, for example, a first tap TA and a second tap TB. However, the example embodiments are not limited thereto, and in some embodiments, each of the plurality of pixels PX may include one tap or three (or more) taps. Each of the plurality of pixels PX may further include a drain shutter DS.

The pixel PX may have a rectangular shape. The rectangular shape may indicate a layout when viewed from the first surface 15-1 or the second surface 15-2 of the semiconductor substrate 15 in FIG. 5A on which the pixel arrays 110j and 110k are formed. In some embodiments, the rectangular shape may be a shape defined by the DTI 16 of FIG. 5A.

Referring to FIG. 13A, pixels PX arranged in adjacent rows may be arranged to be staggered. In the pixel array 110j, pixels PX arranged in odd rows and pixels PX arranged in even rows may be arranged to be staggered in a column direction, and the pixels PX arranged in the odd rows may be arranged to coincide with each other in the column direction.

Referring to FIG. 13B, pixels PX arranged in adjacent columns may be arranged to be staggered. In the pixel array 110k, pixels PX arranged in odd columns and pixels PX arranged in even columns may be arranged to be staggered in a row direction, and the pixels PX arranged in the odd columns may be arranged to coincide with each other in the row direction.

Figure 14:
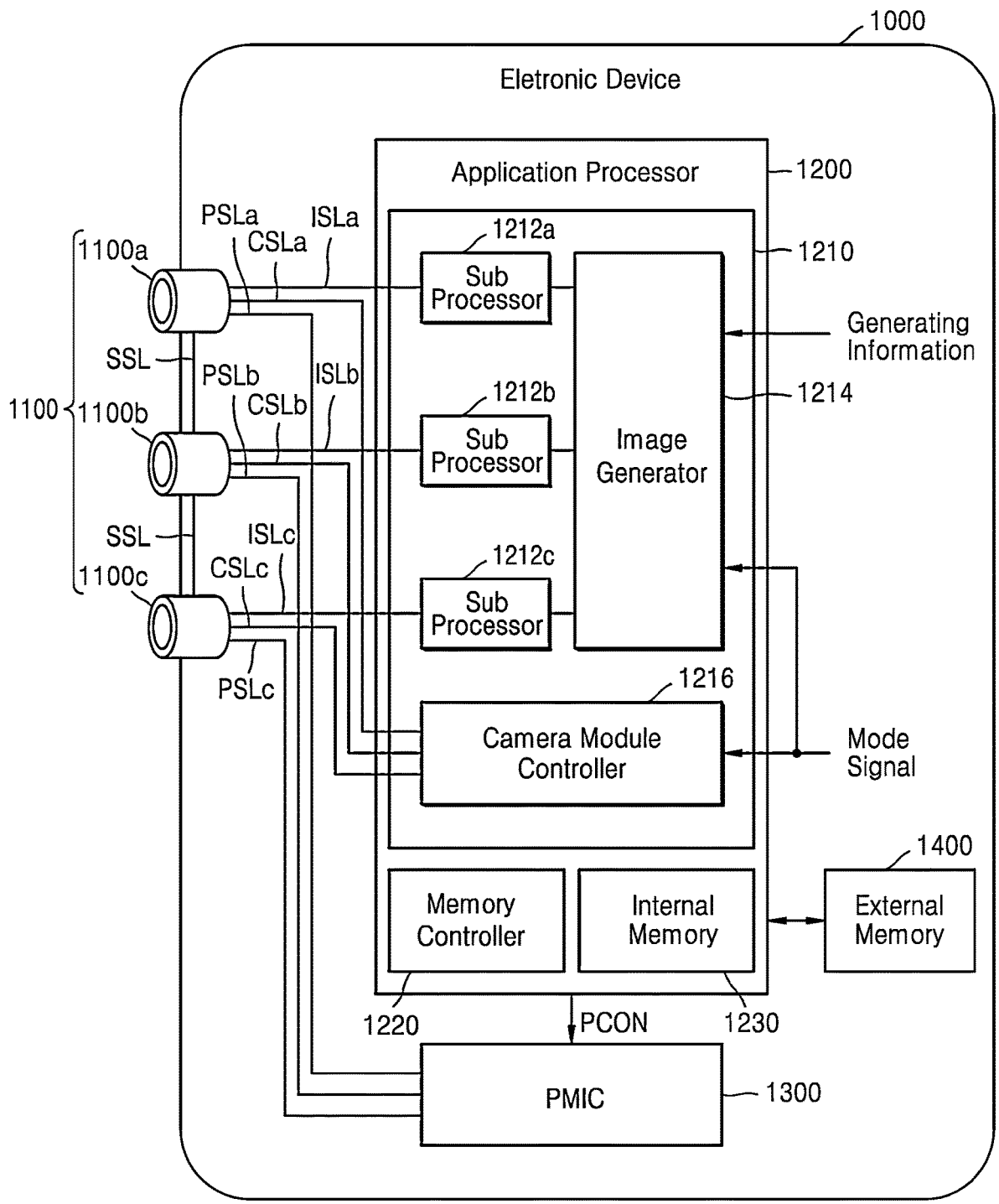
FIG. 14 is a block diagram of an electronic device including a multi-camera module.
Figure 15:
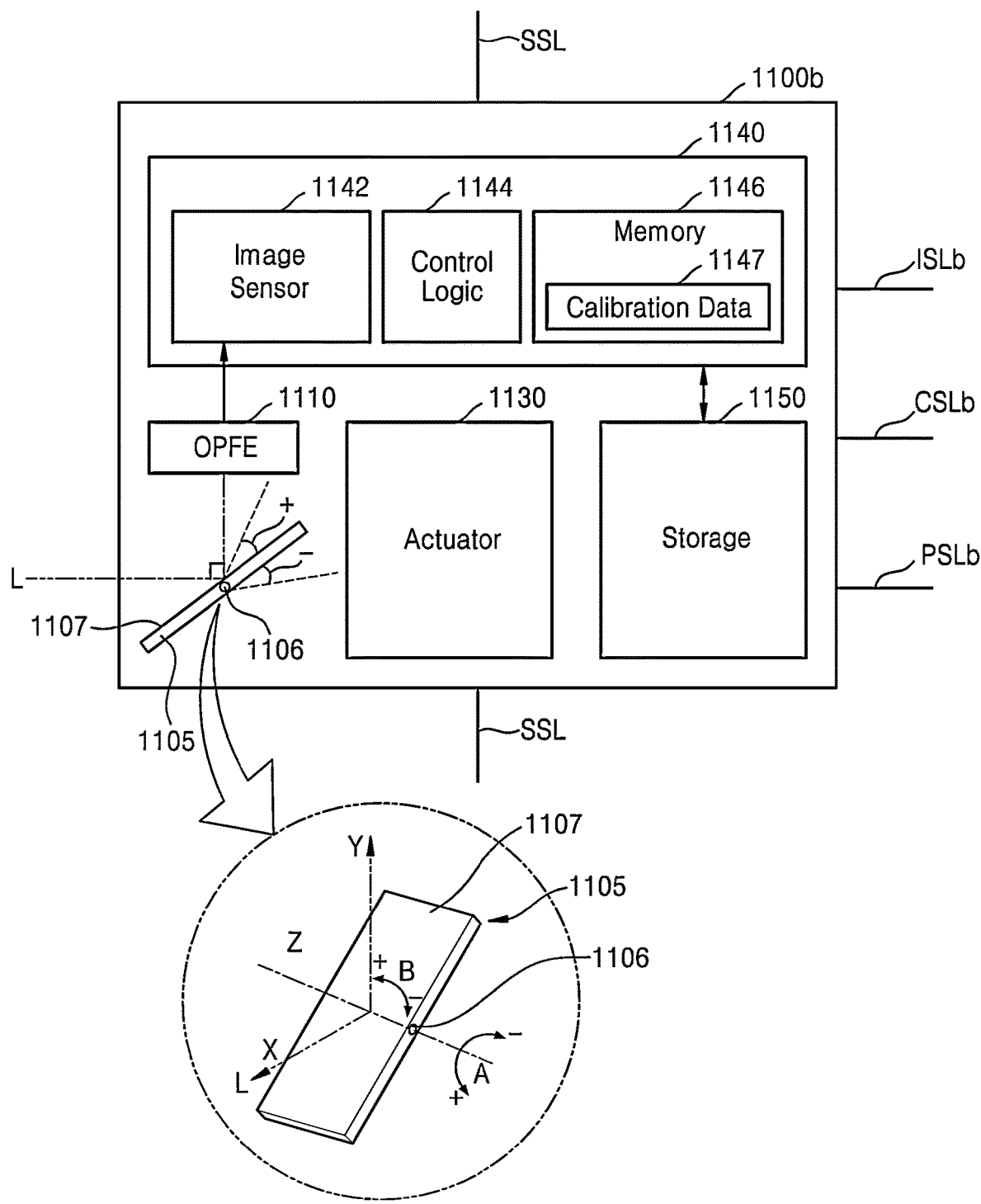
FIG. 15 is a detailed block diagram of the camera module of FIG. 14.

FIG. 14 illustrates an electronic device including a multi-camera module, and FIG. 15 is a detailed block diagram of the camera module of FIG. 14.

Referring to FIG. 14, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although FIG. 14 shows an example in which three camera modules 1100a, 1100b, and 1100c are arranged, the example embodiments are not limited thereto. In some embodiments, for example, the camera module group 1100 may include two camera modules, or may include k (where k is a natural number greater than or equal to 4) camera modules.

Hereinafter, a detailed configuration of the camera module 1100b will be described in more detail with reference to FIG. 15, and the following description may be equally applied to the other camera modules 1100a and 1100c according to some embodiments.

Referring to FIG. 15, the camera module 1100b may include a prism 1105, an optical path folding element (hereinafter, referred to as "OPFE") 1110, an actuator 1130, an image sensing device 1140, and a storage 1150.

The prism 1105 may include, for example, a reflective surface 1107 of a light reflecting material and change a path of light L incident from the outside.

In some example embodiments, the prism 1105 may change the path of the light L incident in a first direction X to a second direction Y perpendicular to the first direction X. In addition, the prism 1105 may rotate on a central axis 1106 of the reflective surface 1107 of a light reflecting material in an A direction or a B direction, thereby changing the path of the light L incident in the first direction X to the second direction Y perpendicular thereto. In this case, the OPFE 1110 may also move in a third direction Z perpendicular to the first direction X and the second direction Y.

In some embodiments, the greatest rotation angle of the prism 1105 in the A direction is less than 15 degrees in a +A direction and may be greater than 15 degrees in a −A direction, as shown in FIG. 15B, but the example embodiments are not limited thereto.

In some embodiments, the prism 1105 may move in a range of approximately 20 degrees or may move between 10 degrees and 20 degrees or between 15 degrees and 20 degrees in a +B or −B direction, and angles of movement may be the same as each other in the +B or −B direction or may be within a range of 1 degree.

In some embodiments, the reflective surface 1106 of the light reflective material of the prism 1105 may move in the third direction (for example, the Z direction) parallel to an extension direction of the central axis 1106.

In some embodiments, the camera module 1100*b* may include two or more prisms, thereby variously changing the path of the light L incident in the first direction X to a second direction Y perpendicular to the first direction X, to the first direction X or the third direction Z, and then to the second direction Y again.

The OPFE 1110 may include, for example, an optical lens including m (wherein m is a natural number) groups. The m lenses may move in the second direction Y to change an optical zoom ratio of the camera module 1100*b*. For example, when a basic optical zoom ratio of the camera module 1100*b* is referred to as Z, and when m optical lenses included in the OPFE 1110 are moved, the optical zoom ratio of the camera module 1100*b* may be changed to 3Z, 5Z, or more.

The actuator 1130 may move the OPFE 1110, the prism 1105, and/or an optical lens (hereinafter, referred to as an optical lens) to a specific position. For example, the actuator 1130 may adjust a position of the optical lens for accurate sensing so that an image sensor 1142 is located at a focal length of the optical lens.

The image sensing device 1140 may include an image sensor 1142, a control logic 1144, and a memory 1146. The image sensor 1142 may sense an image of a sensing target by using the light L provided through the optical lens.

The control logic 1144 may control operations of the camera module 1100*b* and process the sensed image. For example, the control logic 1144 may control the operations of the camera module 1100*b* according to a control signal provided through a control signal line CSLb, and may extract image data (for example, face, arms, legs, and the like of in an image) corresponding to a specific image in the sensed image or perform image processing such as noise removal.

The memory 1146 may store information, such as calibration data 1147 for the operation of the camera module 1100*b*. The calibration data 1147 may be information for the camera module 1100*b* to generate image data by using the light L provided from the outside and may include, for example, information on a degree of rotation, information on a focal length, information on an optical axis, and the like. When the camera module 1100*b* includes a multi-state camera whose focal length is changed according to a position of the optical lens, the calibration data 1147 may include information on focal length values for each position (or state) of the optical lens and on auto focusing.

The storage 1150 may store image data sensed by the image sensor 1142. In some example embodiments, the storage 1150 may be arranged outside the image sensing device 1140 and may be implemented in a stacked form with a sensor chip constituting the image sensing device 1140. In some embodiments, the image sensor 1142 may include a first chip, and the control logic 1144, the storage 1150, and the memory 1146 may include a second chip so that the two chips may be stacked.

In some embodiments, the storage 1150 may include an electrically erasable programmable read-only memory (EE-PROM), but the example embodiments are not limited thereto. In some embodiments, the image sensor 1142 may include a pixel array, and the control logic 1144 may include an analog to digital converter and an image signal processor for processing the sensed image.

Referring to FIGS. 14 and 15, in some embodiments, each of the plurality of camera modules 1100*a*, 1100*b*, and 1100*c* may include an actuator 1130. Accordingly, the plurality of camera modules 1100*a*, 1100*b*, and 1100*c* may include the calibration data 1147 which are the same as each other or different from each other according to an operation of the actuator 1130 included therein.

In some embodiments, one camera module (for example, 1100*b*) among the plurality of camera modules 1100*a*, 1100*b*, and 1100*c* may be a folded lens-type camera module including the prism 1105 and OPFE 1110 described above, and the other camera modules (for example, 1100*a* and 1100*c*) may be vertical-type camera modules that do not include the prism 1105 and/or the OPFE 1110, but the example embodiments are not limited thereto.

In some embodiments, one camera module (for example, 1100*c*) among the plurality of camera modules 1100*a*, 1100*b*, and 1100*c* may be a depth camera of a vertical shape for extracting depth information by using, for example, infrared ray (IR).

The image sensor module 10 according to some example embodiments, described with reference to FIG. 1, may be implemented as a depth camera, and/or the image sensor 100 of FIG. 1 to which the pixel array 110 of FIG. 1 is applied, according to some example embodiments may be applied.

The pixel array 110 may have a hexagonal pattern in which the layout of each of the plurality of pixels PX has a hexagon, or the pixel array 110 may have a staggered pattern in which the pixels PX are arranged to be staggered between columns or rows. The pixel array 110 having a hexagonal pattern or a staggered pattern may match light spots irradiated to an object, and thus, the sensing efficiency of the image sensor 100 may be improved. Also, the image sensor 100 may generate image data IDT suitable for object recognition by a neural network operation based on a plurality of pixel signals generated by the pixel array 110 having a hexagonal pattern or a staggered pattern.

In some example embodiments, the application processor 1200 may merge image data provided from the depth camera with image data provided from another camera module (for example, 1100*a* or 1100*b*) and provide a three-dimensional (3D) depth image.

In some embodiments, at least two camera modules (for example, 1100*a* and 1100*b*) among the plurality of camera modules 1100*a*, 1100*b*, and 1100*c* may have different angles of field of view. For example, optical lenses of at least two camera modules (for example, 1100*a* and 1100*b*) among the plurality of camera modules 1100*a*, 1100*b*, and 1100*c* may be different from each other, but the example embodiments are not limited thereto.

In addition, in some example embodiments, angles of field of view of each of the plurality of camera modules 1100*a*, 1100*b*, and 1100*c* may be different from each other. For example, the camera module 1100*a* may be an ultrawide camera, the camera module 1100*b* may be a wide camera, and the camera module 1100*c* may be a tele camera but are not limited thereto. In this case, the optical lenses included in each of the plurality of camera modules 1100*a*, 1100*b*, and 1100*c* may also be different from each other, but the example embodiments are not limited thereto.

In some embodiments, the plurality of camera modules 1100*a*, 1100*b*, and 1100*c* may be physically separated from each other and arranged. For example, a sensing region of one image sensor 1142 may be not divided by the plurality of camera modules 1100*a*, 1100*b*, and 1100*c*, and an independent image sensor 1142 may be arranged inside each of the plurality of camera modules 1100*a*, 1100*b*, and 1100*c*.

Referring back to FIG. 15, the application processor 1200 may include an image processing device 1210, a memory controller 1220, and an internal memory 1230. The application processor 1200 may implemented separately from the plurality of camera modules 1100*a*, 1100*b*, and 1100*c*. For example, the application processor 1200 and the plurality of camera modules 1100*a*, 1100*b*, and 1100*c* may be implemented as separate semiconductor chips. The image processing device 1210 may include a plurality of sub-image processors 1212*a*, 1212*b*, and 1212*c*, an image generator 1214, and a camera module controller 1216.

The image processing device 1210 may include the plurality of sub-image processors 1212*a*, 1212*b*, and 1212*c* corresponding to the plurality of camera modules 1100*a*, 1100*b*, and 1100*c*, respectively.

Image data generated from each of the camera modules 1100*a*, 1100*b*, and 1100*c* may be provided to the corresponding sub-image processors 1212*a*, 1212*b*, and 1212*c* through image signal lines ISLa, ISLb, and ISLc, which may be separated from each other. For example, image data generated by the camera module 1100*a* may be provided to the sub-image processor 1212*a* through an image signal line ISLa, image data generated by the camera module 1100*b* may be provided to the sub-image processor 1212*b* through an image signal line ISLb, and image data generated by the camera module 1100*c* may be provided to the sub-image processor 1212*c* through an image signal line ISLc. Such image data transmission may be performed by using, for example, a camera serial interface (CSI) based on a mobile industry processor interface (MIPI) but is not limited thereto.

In some embodiments, one sub-image processor may be arranged to correspond to a plurality of camera modules. For example, the sub-image processor 1212*a* and the sub-image processor 1212*c* may be integrated into one sub-image processor without being separated from each other as shown in FIG. 15A, and image data provided from the camera modules 1100*a* and 1100*c* may be selected by a selection element (for example, a multiplexer) and/or the like and then provided to the integrated sub-image processor. In this case, the sub-image processor 1212*b* may receive image data from the camera module 1100*b* without being integrated thereinto.

In addition, in some embodiments, image data generated by the camera module 1100*a* may be provided to the sub-image processor 1212*a* through the image signal line ISLa, image data generated by the camera module 1100*b* may be provided to the sub-image processor 1212*b* through the image signal line ISLb, and image data generated by the camera module 1100*c* may be provided to the sub-image processor 1212*c* through the image signal line ISLc. In addition, image data processed by the sub-image processor 1212*b* may be directly provided to the image generator 1214, and image data processed by the sub-image processors 1212*a* and 1212*c* may be selected by selection elements (for example, multiplexers) or the like and then provided to the image generator 1214.

Each of the sub-image processors 1212*a*, 1212*b*, and 1212*c* may perform image processing such as bad pixel correction, 3A adjustments of auto-focus correction, auto-white balance, auto-exposure correction, noise reduction, sharpening, gamma control, re-mosaic, and/or the like for the image data provided from the camera modules 1100*a*, 1100*b*, and 1100*c*.

In some embodiments, re-mosaic signal processing may be performed for each of the camera modules 1100*a*, 1100*b*, and 1100*c*, and then, results of the re-mosaic signal processing may be provided to the sub-image processors 1212*a*, 1212*b*, and 1212*c*.

The image data processed by each of the sub-image processors 1212*a*, 1212*b*, and 1212*c* may be provided to the image generator 1214. The image generator 1214 may generate an output image by using the image data provided from each of the sub-image processors 1212*a*, 1212*b*, and 1212*c* according to image generation information or a mode signal.

The image generator 1214 may generate an output image by merging at least some of the image data generated by the image processors 1212*a*, 1212*b*, and 1212*c* according to the image generation information or the mode signal. In addition, the image generator 1214 may generate the output image by selecting any one of the image data generated by the image processors 1212*a*, 1212*b*, and 1212*c* according to the image generation information or the mode signal.

In some embodiments, the image generation information may include a zoom signal and/or a zoom factor. In addition, in some embodiments, the mode signal may be a signal based on, for example, a mode selected by a user.

When the image generation information is a zoom signal (zoom factor), and when the camera modules 1100*a*, 1100*b*, and 1100*c* have different fields of view (angles of field of view), the image generator 1214 may perform different operations depending on types of the zoom signal. For example, when the zoom signal is a first signal, the image generator 1214 may generate an output image by using image data outputted from the sub-image processors 1212*a* and 1212*b* among image data outputted from the sub-image processors 1212*a* and 1212*c*. When the zoom signal is a second signal different from the first signal, the image generator 1214 may generate an output image by using image data outputted from the sub-image processors 1212*c* and 1212*b* among image data outputted from the sub-image processors 1212*a* and 1212*c*. If the zoom signal is a third signal different from the first signal and the second signal, the image generator 1214 does not perform the image data merging and generate the output image by selecting any one of image data outputted from each of the sub-image processors 1212*a*, 1212*b*, and 1212*c*. However, the example embodiments are not limited thereto, and a method of processing image data may be modified to meet application criteria.

In some embodiments, the image processing device 1210 may further include a selector (not shown) that selects outputs of the sub-image processors 1212*a*, 1212*b*, and 1212*c* and transmits the selected output to the image generator 1214. In some embodiments, the selection unit may be implemented as a multiplexer, for example, a 3×1 multiplexer.

For example, the selector may perform different operations according to the zoom signal and/or the zoom factor. For example, when the zoom signal is a fourth signal (for example, a zoom ratio is a first ratio), the selector may select any one of outputs of the sub-image processors 1212*a*, 1212*b*, and 1212*c* and transmit the selected output to the image generator 1214.

In addition, when the zoom signal is a fifth signal (e.g., different from the fourth signal—for example, the zoom ratio is a second ratio), the selector may sequentially transmit p (wherein p is a natural number greater than or equal to 2) outputs among the outputs of the sub-image processors 1212*a*, 1212*b*, and 1212*c* to the image generator 1214. For example, the selector may sequentially transmit the output of the sub-image processor 1212*b* and the output of the sub-image processor 1212*c* to the image generator 1214. In addition, the selector may sequentially transmit the output of the sub-image processor 1212*a* and the output of the sub-image processor 1212*b* to the image generator 1214. The image generator 1214 may generate one output image by merging the p outputs that are sequentially received.

In some example embodiments, the sub-image processors 1212*a*, 1212*b*, and 1212*c* may perform image processing such as re-mosaic, down scaling to a video/preview resolution size, gamma correction, and high dynamic range (HDR) processing, and then the processed image data is transmitted to the image generator 1214. Accordingly, even when the processed image data is provided to the image generator 1214 through the selector and one signal line, an image merging operation of the image generator 1214 may be performed at a high speed.

In some embodiments, the image generator 1214 may receive a plurality of pieces of image data having different exposure times from at least one of the plurality of sub-image processors 1212*a*, 1212*b*, and 1212*c*, and perform the high dynamic range (HDR) processing on the plurality of pieces of image data, thereby generating merged image data with an increased dynamic range.

The camera module controller 1216 may provide control signals to the camera modules 1100*a*, 1100*b*, and 1100*c*. The control signals generated by the camera module controller 1216 may be provided to the corresponding camera modules 1100*a*, 1100*b*, and 1100*c* through the control signal lines CSLa, CSLb, and CSLc separated from each other.

Any one of the plurality of camera modules 1100*a*, 1100*b*, and 1100*c* may be designated as a master camera (for example, 1100*b*) (e.g., according to image generation information including a zoom signal and/or a mode signal) and/or the other camera modules (for example, 1100*a* and 1100*c*) may be designated as slave cameras. Such information may be included in the control signals and provided to the corresponding camera modules 1100*a*, 1100*b*, and 1100*c* through the control signal lines CSLa, CSLb, and CSLc separated from each other.

Camera modules operating as a master and slaves may be changed according to a zoom factor or an operation mode signal. For example, when an angle of field of view of the camera module 1100*a* is wider than an angle of field of view of the camera module 1100*b* and a zoom factor thereof represents a low zoom ratio, the camera module 1100*a* may operate as a master, and the camera module 1100*b* may operate as a slave. In contrast, in some example embodiments, when the zoom factor represents a high zoom ratio, the camera module 1100*b* may operate as a master and the camera module 1100*a* may operate as a slave.

In some embodiments, the control signal provided from the camera module controller 1216 to each of the camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may transmit the sync enable signal to the camera module 1100*b*. When receiving the sync enable signal, the camera module 1100*b* may generate a sync signal based on the provided sync enable signal and transmit the generated sync signal to the camera modules 1100*a* and 1100*c* through a sync signal line SSL. The camera module 1100*b* and the camera modules 1100*a* and 1100*c* may be synchronized with the sync signal to transmit image data to the application processor 1200.

In some embodiments, the control signals provided from the camera module controller 1216 to the plurality of camera modules 1100*a*, 1100*b*, and 1100*c* may include mode information according to a mode signal. The plurality of camera modules 1100*a*, 1100*b*, and 1100*c* may operate in a first operation mode and a second operation mode in relation to a sensing speed, based on the mode information.

The plurality of camera modules 1100*a*, 1100*b*, and 1100*c* may generate image signals at a first speed in a first operation mode (for example, generate the image signals of a first frame rate), and encode the image signals at a second speed higher than the first speed (for example, encode image signals of a second frame rate higher than the first frame rate), and transmit the encoded image signals to the application processor 1200. For example, the second speed may be lower than or equal to 30 times the first speed.

The application processor 1200 may store the received image signal, that is, the encoded image signal, in the memory 1230 included therein or in the external memory 1400 outside the application processor 1200, and then, read the encoded image signal from the memory 1230 or the external memory 1400 and decode the encoded signal, and display image data generated based on the decoded image signal. For example, a corresponding sub-image processor among the plurality of sub-image processors 1212*a*, 1212*b*, and 1212*c* of the image processing device 1210 may perform decoding, and also perform image processing on the decoded image signal.

The plurality of camera modules 1100*a*, 1100*b*, and 1100*c* may each generate an image signal at a third speed lower than the first speed in the second operation mode (for example, an image signal of a third frame rate lower than the first frame rate) and transmit the image signal to the application processor 1200. The image signal provided to the application processor 1200 may be a signal which is not encoded. The application processor 1200 may perform image processing on the received image signal or may store the image signal in the memory 1230 or the external memory 1400.

The PMIC 1300 may supply power, for example, a power supply voltage to the plurality of camera modules 1100*a*, 1100*b*, and 1100*c*. For example, the PMIC 1300 may supply first power to the camera module 1100*a* through a power signal line PSLa, second power to the camera module 1100*b* through a power signal line PSLb, and third power to the camera module 1100*c* through a power signal line PSLc, under the control of the application processor 1200.

The PMIC 1300 may generate power corresponding to each of the plurality of camera modules 1100*a*, 1100*b*, and 1100*c* in response to a power control signal PCON from the application processor 1200 and may also adjust a level of the power. The power control signal PCON may include power adjustment signals for each operation mode of the plurality of camera modules 1100*a*, 1100*b*, and 1100*c*. For example, the operation mode may include a low power mode, and in this case, the power control signal PCON may include information on a camera module operating in the low power mode and a level of power to be set. Levels of powers provided to the plurality of camera modules 1100*a*, 1100*b*, and 1100*c* may be the same as each other or different from each other. In addition, the levels of power may be dynamically changed.

Unless otherwise indicated, any of the functional blocks shown in the figures and described above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to embodiments thereof, it will be understood that various changes in form and details may be made therein without departing from the spirit and scope of the following claims.

What is claimed is:

1. An image sensor for distance measurement, the image sensor comprising:
    a pixel array including a plurality of pixels, the plurality of pixels including
        a plurality of first pixels on a first line, and
        a plurality of second pixels on a second line adjacent to the first line,
    wherein the plurality of first pixels and the plurality of second pixels are staggered from each other, and each of the plurality of first pixels and the plurality of second pixels includes a plurality of modulation gates configured to receive a plurality of modulated signals during a photocharge collection period;
    a row decoder configured to provide control signals and the plurality of modulated signals to the plurality of first pixels and the plurality of second pixels of the pixel array; and
    an analog-to-digital conversion circuit configured to receive a plurality of sensing signals from the pixel array and to convert the plurality of sensing signals into a plurality of digital signals,
    wherein each of the plurality of pixels includes
        a first tap configured to, in response to a first modulated signal, transmit a first phase component of a photocharge, the photocharge generated in response to a received light signal, and
        a second tap configured to, in response to a second modulated signal, transmit a second phase component of the photocharge,
    wherein the first taps in at least three adjacent pixels are connected to a same interconnection line, and
    wherein the at three adjacent pixels includes at least one pixel of the plurality of first pixels and at least one pixel of the plurality of second pixels.

2. The image sensor of claim 1, wherein the pixel array includes a hexagonal grid that separates each of the plurality of pixels.

3. The image sensor of claim 2, wherein the hexagonal grid includes a deep trench insulator (DTI) structure.

4. The image sensor of claim 1,
    wherein the first modulated signal and the second modulated signal have a same frequency as modulated light irradiated to an object,
    the first modulated signal has a same phase as the modulated light or a phase difference of 90° from the modulated light, and
    the second modulated signal has a phase difference of 180° from the first modulated signal.

5. The image sensor of claim 4, wherein each of the first tap and the second tap includes:
    a modulation gate configured to receive one of the plurality of modulated signals and to transmit the photocharge in response to the received modulated signal;
    a storage device configured to store the photocharge; and
    a transfer gate configured to output the photocharge in a read period.

6. The image sensor of claim 4, wherein the first tap and the second tap are symmetrically arranged between adjacent first pixels among the plurality of first pixels.

7. The image sensor of claim 4, wherein each of the plurality of pixels further includes:
    a charge collector including a photoelectric conversion device configured to generate the photocharge; and
    one or more read circuits connected to the first tap and the second tap.

8. The image sensor of claim 7, wherein the one or more read circuits are shared between at least two adjacent pixels of the plurality of pixels.

9. The image sensor of claim 7, wherein the charge collector further includes:
    a photogate configured to generate the photocharge in response to a photogate control signal having a fixed level during the photocharge collection period.

10. The image sensor of claim 7, wherein each of the plurality of pixels further:
    includes an overflow gate connected to the charge collector and configured to, in response to an overflow control gate signal, remove photocharges generated in a read period.

11. The image sensor of claim 1, wherein each of the plurality of pixels further includes:
    a third tap configured to, in response a third modulated signal, transmit a third phase component of the photocharge,
    wherein the first modulated signal, the second modulated signal, and the third modulated signal have a same frequency as modulated light irradiated to an object,
    the first modulated signal has a same phase as the modulated light,
    the second modulated signal has a phase difference of 120° from the first modulated signal, and
    the third modulated signal has a phase difference of 120° from the second modulated signal.

12. The image sensor of claim 11, wherein at least one of the first tap, the second, tap, or the third tap is adjacent to corresponding first, second, or third taps in adjacent pixels, such that an interface between three adjacent pixels three of the first taps, three of the second taps, or three of the third taps are adjacent to each other.

13. An image sensor for distance measurement, the image sensor comprising:
    a pixel array including a plurality of pixels, the plurality of pixels including
        a plurality of first pixels in a first row, and
        a plurality of second pixels in a second row adjacent to the first row,
    wherein the plurality of first pixels and the plurality of second pixels are staggered from each other in a column direction,
    wherein each of the plurality of pixels includes
        a charge collector configured to generate a charge according to a received light signal;
        a first tap configured to transmit a first phase component of the charge in response to a first modulated signal;
        a second tap configured to transmit a second phase component of the charge in response to a second modulated signal having a same frequency as and a different phase from the first modulated signal; and
        at least one read circuit connected to the first tap and the second tap,
    wherein the first taps in at least three adjacent pixels are connected to a same interconnection line, and
    wherein the at three adjacent pixels includes at least one pixel of the plurality of first pixels and at least one pixel of the plurality of second pixels.

14. The image sensor of claim 13, wherein a center of each of the plurality of first pixels and a center of each of the plurality of second pixels do not coincide with each other in the column direction.

15. The image sensor of claim 13, wherein a layout of each of the plurality of pixels has a hexagonal pattern.

16. The image sensor of claim 13, wherein a layout of each of the plurality of pixels has a rectangular pattern.

17. The image sensor of claim 13, wherein
the first tap and the second tap are symmetrically arranged between adjacent pixels among the plurality of pixels, and
the first taps in the adjacent pixels are connected to a same interconnection line.

18. An image sensor module comprising:
a light source configured to irradiates modulated light to an object; and
an image sensor configured to measure a distance to the object by sensing the modulated light reflected from the object, the image sensor including
a pixel array including a plurality of pixels staggered from each other, each of the plurality of pixels including a plurality of modulation gates configured to receive a plurality of modulated signals during a photocharge collection period, and
a row decoder configured to provide a control signal and the plurality of modulated signals to the plurality of pixels,
wherein each of the plurality of pixels includes
a first tap configured to, in response to a first modulated signal, transmit a first phase component of a photocharge, the photocharge generated in response to a received light signal, and
a second tap configured to, in response to a second modulated signal, transmit a second phase component of the photocharge,
wherein the first taps in at least three adjacent pixels are connected to a same interconnection line, and
wherein the at three adjacent pixels includes at least one pixel of the plurality of pixels in a first row and at least one pixel of the plurality of pixels in a second row.

* * * * *